US009450057B2

(12) United States Patent
Wu et al.

(10) Patent No.: US 9,450,057 B2
(45) Date of Patent: Sep. 20, 2016

(54) SPLIT GATE CELLS FOR EMBEDDED FLASH MEMORY

(71) Applicant: Taiwan Semiconductor Manufacturing Co., Ltd., Hsin-Chu (TW)

(72) Inventors: Chang-Ming Wu, New Taipei (TW); Shih-Chang Liu, Alian Township (TW); Chia-Shiung Tsai, Hsin-Chu (TW); Ru-Liang Lee, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/276,631

(22) Filed: May 13, 2014

(65) Prior Publication Data
US 2015/0236110 A1    Aug. 20, 2015

Related U.S. Application Data

(63) Continuation-in-part of application No. 14/182,952, filed on Feb. 18, 2014.

(51) Int. Cl.
*H01L 29/788* (2006.01)
*H01L 29/423* (2006.01)
*H01L 27/115* (2006.01)
*H01L 29/66* (2006.01)
*H01L 29/792* (2006.01)

(52) U.S. Cl.
CPC ..... *H01L 29/42348* (2013.01); *H01L 27/1157* (2013.01); *H01L 29/42344* (2013.01); *H01L 29/66833* (2013.01); *H01L 29/792* (2013.01); *H01L 29/7923* (2013.01)

(58) Field of Classification Search
CPC .......... H01L 29/42324; H01L 29/42344; H01L 29/42348
USPC .............................. 257/316, 317, 324, 326
See application file for complete search history.

(56) References Cited

U.S. PATENT DOCUMENTS

| 6,291,297 | B1 | 9/2001 | Chen |
| 7,271,061 | B2 | 9/2007 | Jeon et al. |
| 2008/0029808 | A1 | 2/2008 | Jeon et al. |
| 2009/0050956 | A1 | 2/2009 | Ishimaru et al. |

(Continued)

FOREIGN PATENT DOCUMENTS

JP    2007258497 A    10/2007

OTHER PUBLICATIONS

Non Final Office Action Dated Oct. 8, 2015 U.S. Appl. No. 14/182,952.
Caleb Yu-Sheng Cho, et al.; "A Novel Self-Aligned Highly Reliable Sidewall Split-Gate Flash Memory"; IEEE Transactions on Electron Devices, vol. 53, No. 3, Mar. 2006, p. 465-473.

(Continued)

*Primary Examiner* — Matthew E Warren
(74) *Attorney, Agent, or Firm* — Eschweiler & Associates, LLC

(57) ABSTRACT

In a method of forming a split gate memory cell, a sacrificial spacer is formed over a semiconductor substrate. A first layer of conductive material is formed over a top surface and sidewalls of the sacrificial spacer. A first etch back process is formed on the first layer of conductive material to expose the top surface of the sacrificial spacer and upper sidewall regions of the sacrificial spacer. A conformal silicide-blocking layer is then formed which extends over the etched back first layer of conductive material and over the top surface of the sacrificial spacer.

20 Claims, 19 Drawing Sheets

(56) References Cited

U.S. PATENT DOCUMENTS

| | | |
|---|---|---|
| 2009/0315100 A1 | 12/2009 | Jeong |
| 2010/0006914 A1* | 1/2010 | Nakagawa ........ H01L 21/28282 257/304 |
| 2015/0179816 A1* | 6/2015 | Williams .......... H01L 21/28273 257/326 |

OTHER PUBLICATIONS

U.S. Appl. No. 14/182,952, filed Feb. 18, 2014.
Final Office Action Dated Mar. 24, 2016 U.S. Appl. No. 14/182,952.
Notice of Allowance Dated Jul. 1, 2016 U.S. Appl. No. 14/182,952.

* cited by examiner

SPLIT GATE CELLS FOR EMBEDDED FLASH MEMORY

REFERENCE TO RELATED APPLICATION

This application is a continuation-in-part application which claims priority to U.S. application Ser. No. 14/182, 952 filed on Feb. 18, 2014 and entitled, "SPLIT GATE MEMORY DEVICE AND METHOD OF FABRICATING THE SAME"; the contents of which are incorporated herewith in their entirety.

BACKGROUND

Flash memory is an electronic non-volatile computer storage medium that can be electrically erased and reprogrammed. Flash cells are used in a wide variety of commercial and military electronic devices and equipment. In flash memory cells, over erase associated with stacked gate structures is eliminated by the use of a split gate structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
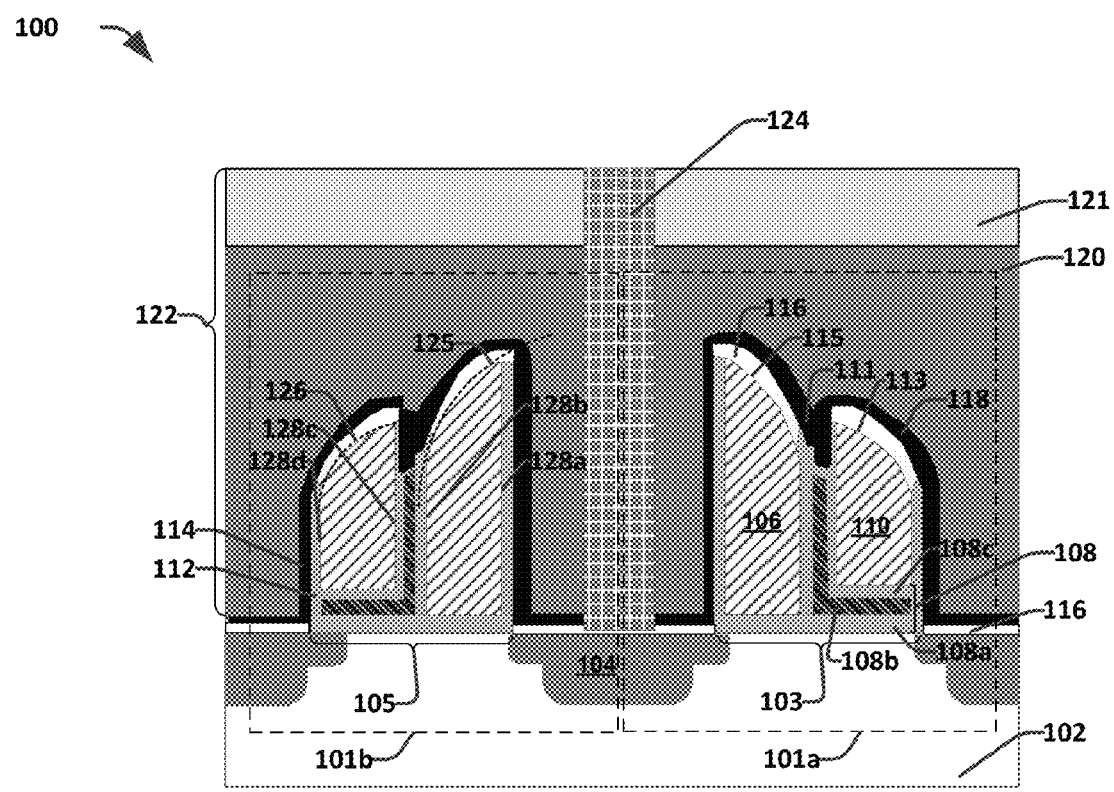
FIG. 1 shows a cross-sectional view of a pair of adjacent memory cells according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Split gate memory cells have promising advantages over stacked gate memory cells such as low power consumption, high injection efficiency, less susceptibility to short channel effects, and over erase immunity. The built in select gate transistor in a split gate memory cell can effectively get rid of the on-chip erase procedures that were used in traditional stacked gate cells to resolve over erase problems. Traditional fabrication methods of the split gate memory cells involve many processing steps which include patterned masking and dry etching steps. The large number of processing steps results in substantial fabrication costs.

The conventional process for fabricating flash memory usually uses photomasks to define the devices. Since the precision of the photomasks is limited, misalignment can occur for features with dimensions which are less than some minimal line width design rule or which are spaced more closely than some minimal spacing design rule. This misalignment, if any, can lead to gaps between elements intended to be coupled together (e.g., undesired open circuits) and/or can lead to bridging between elements intended to be isolated (e.g., undesired short circuits), either of which can cause the flash memory device to fail. Therefore, density for conventional flash memory devices has been limited by these design rules. To pack these conventional flash cells closer together, self-aligned select gates (SG) and memory gates (MG) are used. These self-aligned structures form a pair of flash gates—so called "split gates"—on opposite sides of a sacrificial spacer. This process enables formation of symmetric structures with smaller critical dimensions and, hence, denser data storage.

In order to lower manufacturing cost, simplify the manufacturing procedures, and increase operational speed for a semiconductor device, a trend in semiconductor manufacturing is to integrate different devices, such as a memory cell and a logic circuit, on the same wafer. An example of this is modern embedded flash memory devices. These embedded flash memory devices include an array of flash memory cells and periphery circuitry formed on the same wafer. High-k metal gate (HKMG) technology has become one of the front-runners for the next generation of CMOS devices, and this technology incorporates a high-k dielectric, which reduces leakage and improves the dielectric constant. To help with fermi-level pinning and to allow the gate to be adjusted to low threshold voltages, a metal gate is used instead of a polysilicon gate. By combining the metal gate and low-k dielectric, HKMG technology reduces gate leakage, thereby increasing the transistor capacitance and allowing chips to function with reduced power needs. HKMG process technology involves two distinctly different integration flows, namely traditional gate and replacement gate. In a traditional gate approach, the transistor's gate stack is fabricated first, followed by the source and drain, very much like traditional CMOS transistor architecture. A replacement gate process is just the opposite, where a sacrificial gate stack is stripped away to form a recess after source and drain regions have been formed, and a replacement gate is fabricated in the recess after formation of the source and drain regions.

Flash memory formed by conventional methods can only be embedded in traditional gate HKMG technology and is not compatible with replacement HKMG technology. The reason for this incompatibility stems from a chemical mechanical polishing (CMP) process used in the replacement gate process. This CMP process is performed immediately before the polysilicon gates are removed, and planarizes the structure until the top surface of the polysilicon gates are reached. In self aligned flash memory cells, usually a self-aligned silicide or salicide is formed on the base of the semiconductor surface in the active regions to provide electrical connection. This layer of salicide (self-aligned silicide) is also formed on top surfaces of the select gates (SGs) and the memory gates (MGs) during salicide formation on the base of the semiconductor surface. If self-aligned split-gate flash memory cells with salicide on top of the gate structures are embedded in the replacement gate process of a HKMG integrated circuit, the above mentioned CMP process will damage the SGs of the memory cells due to metal ions from the silicide contaminating other areas of the wafer/IC as CMP occurs. Ultimately, this contamination can reduce manufacturing yields and render some ICs unusable or less than optimal.

Accordingly, the present disclosure relates to a new processing method which makes it practical to integrate embedded flash memory in a replacement gate HKMG circuit by protecting the top surfaces of SGs before salicide formation. In particular, in some embodiments, a silicide-blocking material is formed over the top surfaces of the SGs. This silicide-blocking material prevents silicide formation on the top surfaces of the SGs during silicide formation on the active regions. Therefore, when CMP is carried out, the top surfaces of the SGs (now lacking a salicide/silicide thereon) are still subject to a CMP operation to planarize the SG top surfaces with other features on a periphery of the chip. However, because the top surfaces of the SG no longer include the salicide/silicide, the CMP operation will not cause contamination for the periphery of the chip as in conventional approaches. Therefore, the resultant embedded flash memory and surrounding CMOS peripheral circuitry can be manufactured with higher yield and better reliability than previous approaches.

FIG. 1 illustrates a cross-sectional view 100 of a pair of adjacent memory cells, according to some embodiments of the present disclosure, namely a first memory cell 101a and a second memory cell 101b. These memory cells 101a and 101b have a first shared common source/drain (S/D) region 104 in a semiconductor body 102 and a first contact 124 that connects to the first shared S/D region 104. In some embodiments, the semiconductor body 102 comprises silicon (Si) and the first contact 124 comprises Ti/TiN (titanium/titanium nitride) and W (tungsten). The pair of adjacent memory cells comprises a first gate structure 103 and a second gate structure 105 that are mirror images of one another. Hence, it is duly specified that all the features illustrated for the first gate structure 103 are applicable to the second gate structure 105. The first gate structure 103 comprises a first select gate (SG) 106 and a first memory gate (MG) 110. In some embodiments, the SG 106 and the MG 110 comprise poly silicon.

The first MG 110 and first SG 106 have non-planar top surfaces, 113 and 115 respectively. Relative to an upper surface of the semiconductor body, each of these non-planar top surfaces 113 and 115 continuously and/or monotonically decrease in height, as one moves along the X-axis, from example, in the direction away from the first contact 124.

In the illustrated example, these non-planar top surfaces 113 and 115 are rounded surfaces with different curvatures. The different curvatures of these surfaces 113, 115 are due to the process steps used to form them. In the illustrated embodiment, the non-planar SG top surface 115 has a first curvature 125, and the non-planar MG top surface 113 has a second curvature 126 that is non-continuous with the first curvature 125. In some embodiments, the curvatures 125 and 126 can be approximated by different radii, wherein the radius of curvature 125 is greater than the radius of curvature 126. Although these curvatures can be approximately by different radii, it will be appreciated that the curvatures need not be truly circular, but can be elliptical, parabolic, hyperbolic, and/or have other curvatures.

In some embodiments, each SG of the memory cells 101a and 101b comprises a first select gate side wall 128a and second select gate side wall 128b, wherein a height of the first select gate side wall 128a is greater than a height of the second select gate side wall 128b. Similarly each MG 110 of the memory cells 101a and 101b comprises a first memory gate side wall 128c and a second memory gate side wall 128d. The first memory gate side wall 128c, which neighbors the second select gate sidewall 128b, has a height greater than a height of the second select gate side wall 128b. In some embodiments, the height of the first memory gate side wall 128c is also greater than a height of the second memory gate sidewall 128d. Formation of the symmetric self-aligned gates with non-planar top surfaces reduce processing steps (as it involves no mask patterning and CMP processes) thereby reducing the manufacturing cost. Further, they provide a distinguishable select gate SG feature that is different from traditional SG structures.

An inter-gate dielectric layer 108 resides in between the first SG 106 and the first MG 110. The inter gate dielectric layer 108 further extends under the first MG 110. In some embodiments, the inter gate dielectric layer 108 comprises an oxide layer 108a, a nitride layer 108b, and a second oxide layer 108c, which are referred to collectively as an ONO (oxide/oxynitride/oxide) structure.

A first dielectric 111 is disposed above the inter-gate dielectric layer 108 and is arranged between the neighboring sidewalls of the first MG 110 and the first SG 106 to provide isolation between the first MG 110 and the first SG 106. In some embodiments, the first dielectric layer 111 comprises SiN (silicon nitride). An oxide 112 is deposited along the side walls of the first MG 110 and the first SG 106. Salicide 116 is deposited over the top surfaces of the SG 106 and the MG 110 as well as on either side of the gate structures 103 and 105 above the semiconductor body 102. A spacer layer 114 is arranged above both the first memory gate 110 and the first SG 106 and has a profile that follows the non-planar top surfaces of the first MG 110 and first SG 106. In some embodiments, the spacer layer 114 comprises SiN or oxide. A contact etch stop layer (CESL) 118 is deposited along the oxide 112 and above the silicide 116. In some embodiments, the CESL layer 118 comprises SiN. A dielectric layer 122 is deposited entirely over the semiconductor body for filling the gaps between the gate structures. The dielectric layer 122 comprises a BPTEOS (borophosphosilicatetetraethylorthosilicate) layer 120 for gap filling and a TEOS (tetetraethylorthosilicate) layer 121 above the BPTEOS layer 120 for preventing water absorption.

Each memory cell 101a, 101b can be thought of as two transistors in series. One is the memory gate transistor (e.g., corresponding to MG 110), and the other is the select gate transistor (e.g. corresponding to SG 106) which is a simple enhancement transistor controlled by the word line. Programming is performed by means of source-side channel hot-electron injection. Poly-to-poly Fowler-Nordheim (FN) electron tunneling is employed for erasing. To change the cell value to a "0", a negative electrical potential is applied to both the gates, such that the electrons stored in the storage node (ONO layer) are drained to the source side of the memory cell. The electrons in the cells of a chip can be returned to normal "1" by the application of a strong positive electric field.

Figure 2:
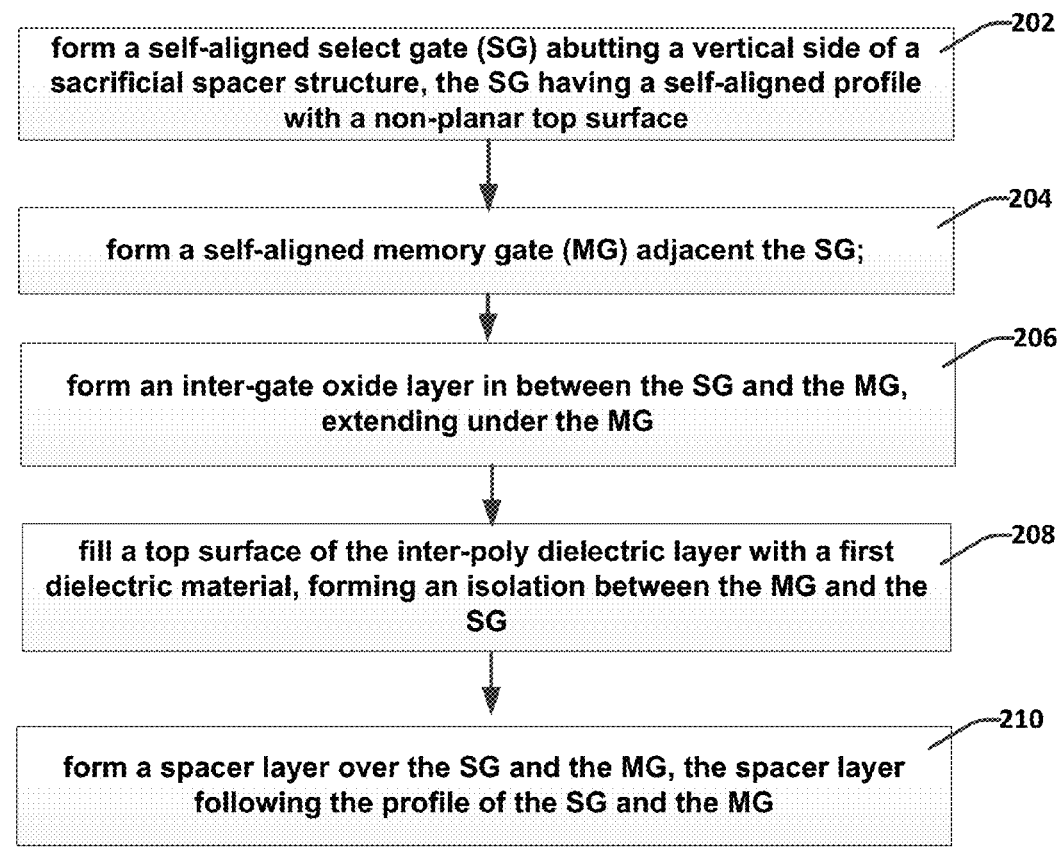
FIG. 2 shows a flow diagram of a method according to some embodiments of the present disclosure.

FIG. 2 shows a flow diagram of a method 200 according to some embodiments of the present disclosure. While disclosed method 200 (and other methods described herein) is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 202 a self-aligned SG is formed abutting a first sidewall of a sacrificial spacer. A symmetric SG is formed on a second opposite sidewall of the same sacrificial spacer. The self-alignment creates a non-planar top surface, which leans towards opposite direction on both the select gates that are formed on either side of the sacrificial spacer.

At 204, a self-aligned memory gate (MG) is formed adjacent the SG.

At 206, an inter-gate dielectric layer is formed in between the SG and the MG, the inter-gate dielectric layer extending under the MG and leaving a recess between upper regions of the MG and SG.

At 208, the recess left by the inter-gate dielectric layer is filled with a first dielectric material to provide isolation between the MG and the SG.

At 210, a spacer layer is formed over the SG and the MG, the spacer layer following the profile of the SG and the MG and having a non-planar top surface.

Figure 3:
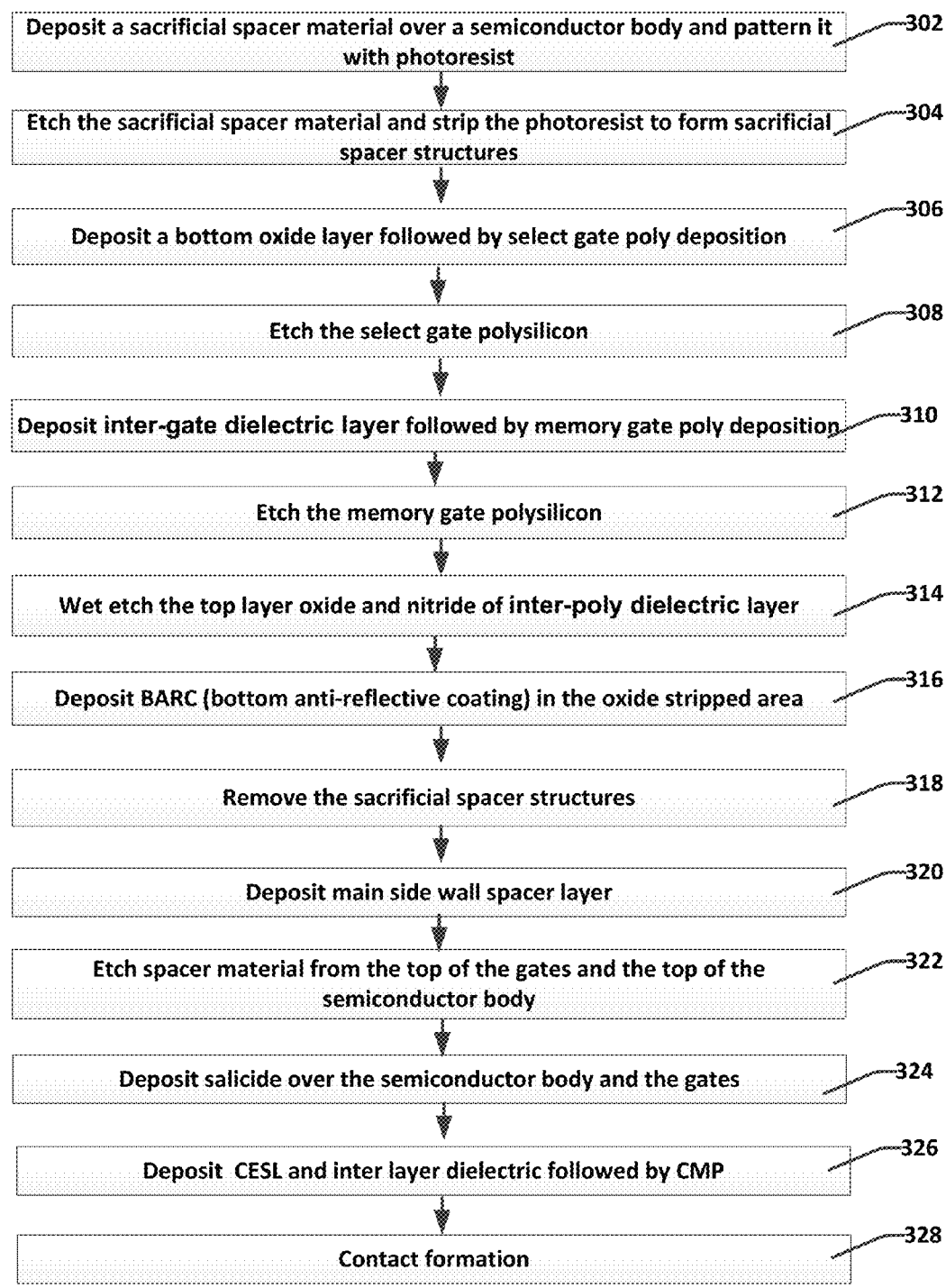
FIG. 3 shows a flow diagram of a method for forming split gate memory device according to some embodiments of the present disclosure.

FIG. 3 shows a flow diagram of a method 300 for forming a split gate memory device according to some embodiments of the present disclosure.

At 302, a sacrificial spacer material is deposited over a semiconductor substrate and patterned with the help of photoresist. In some embodiments, the sacrificial spacer material comprises SiN, SiC and/or SiO2.

At 304, the sacrificial spacer material is etched and the photoresist stripped to create sacrificial spacers over the semiconductor body. In some embodiments, symmetric sacrificial spacers are formed over the semiconductor body. In some embodiments the sacrificial spacer material may be lithographically defined and removed by either plasma/RIE etch or a selective wet etch.

At 306, a bottom oxide layer is deposited entirely over the semiconductor body followed by SG material deposition. In some embodiments, the SG comprises poly silicon.

At 308, the SG poly silicon is etched to form SG structures on either side of the sacrificial spacers. The etching stops at the bottom oxide layer.

At 310, an inter-gate dielectric layer is deposited followed by deposition of MG material. In some embodiments, the inter-gate dielectric layer is the charge storage node and it comprises ONO.

At 312, the MG material/poly silicon is etched to form MG structures on either side of the sacrificial spacer outside the inter-gate dielectric layer.

At 314, the first two layers of the inter-gate dielectric layer or the ONO layer are wet etched. In some embodiments, the ON (oxy nitride) layer is removed by wet etching.

At 316, a bottom anti-reflective coating (BARC) is deposited entirely over the ON (oxy nitride) stripped areas.

At 318, the sacrificial spacers are removed or etched off. The oxide above the sacrificial spacer and the top of the SGs is also removed. In some embodiments, the sacrificial spacers are removed using a wet etchant combination of HF and H3PO4 (hydrogen fluoride and phosphoric acid).

At 320, a main side wall spacer layer is deposited all over the semiconductor body and over the gate structures.

At 322, the spacer layer is etched off from the top of the semiconductor body and from the top of the gate structures, but retained on the gate side walls and over the ONO layer in between the SG and the MG, providing isolation between them.

At 324, a salicide is deposited over the top of the top of the gate structures and the semiconductor body after removing the oxide from their surfaces.

At 326, a contact etch stop layer (CESL) and interlayer dielectric is deposited entirely over the semiconductor body covering all the gaps and they are planarized using a chemical mechanical polishing (CMP) process. In some embodiments, the CESL comprises SiN and the interlayer dielectric layer comprises an oxide.

At 328, another top layer dielectric is deposited over the inter layer dielectric to prevent H2O absorption and metal contacts are formed extending in to the source/drain (S/D) regions. In some embodiments, the inter-layer dielectric used for filling the gap comprises BPTEOS and the top layer dielectric comprises TEOS. In some embodiments, the metal contacts comprises Ti/TiN as a buffer layer which is filled with W.

FIGS. 4-17 show cross-sectional views of a method 300 of forming split gate memory cells according to some embodiments of the present disclosure.

Figure 4:
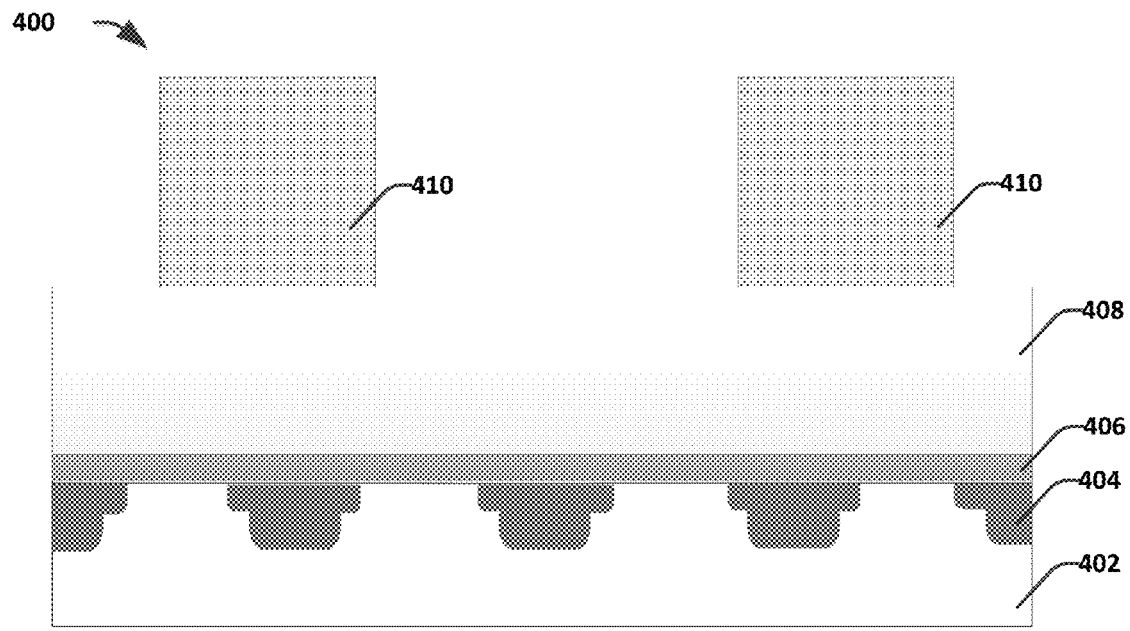
FIGS. 4-17 show cross-sectional views at various stages of forming a split gate memory cell according to some embodiments of the present disclosure.

FIG. 4 illustrates a cross-sectional view 400 at one of the stages of forming split gate memory cells according to some embodiments of the present disclosure, with patterned photo resist 410 over a semiconductor body 402. The semiconductor body 402 has S/D regions 404 diffused or formed within. An oxide layer 406 resides on top of the semiconductor body for protecting the semiconductor body from future etching steps. Over the oxide layer 406 sacrificial spacer material 408 is deposited which is subsequently patterned and etched. The photoresist 410 on top of the sacrificial spacer material 408 used is to pattern the sacrificial spacer material to form sacrificial spacers.

Figure 5:
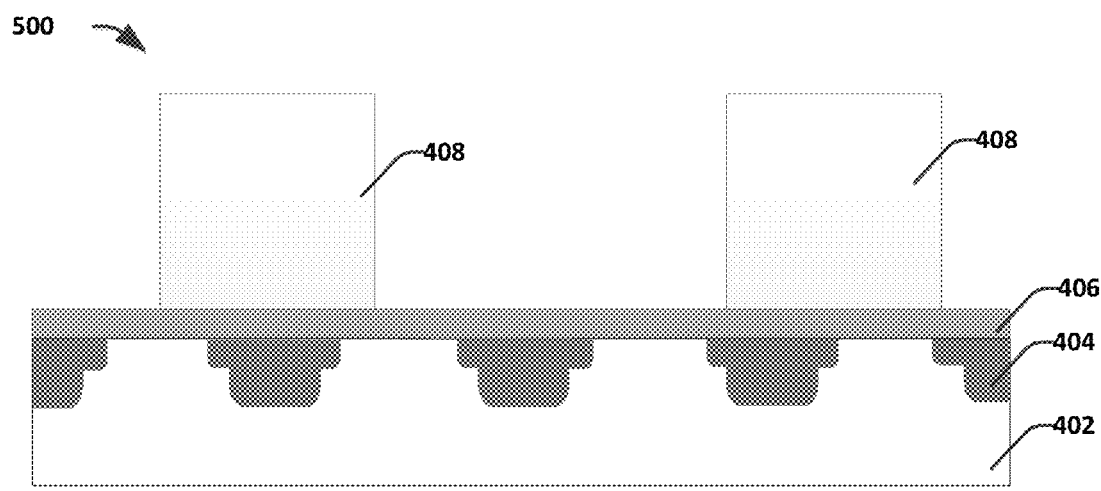

FIG. 5 illustrates a cross-sectional view 500 of another stage of forming split gate memory cells according to some embodiments of the present disclosure, after the sacrificial spacer material 408 is etched and the photo resist is stripped off.

Figure 6:
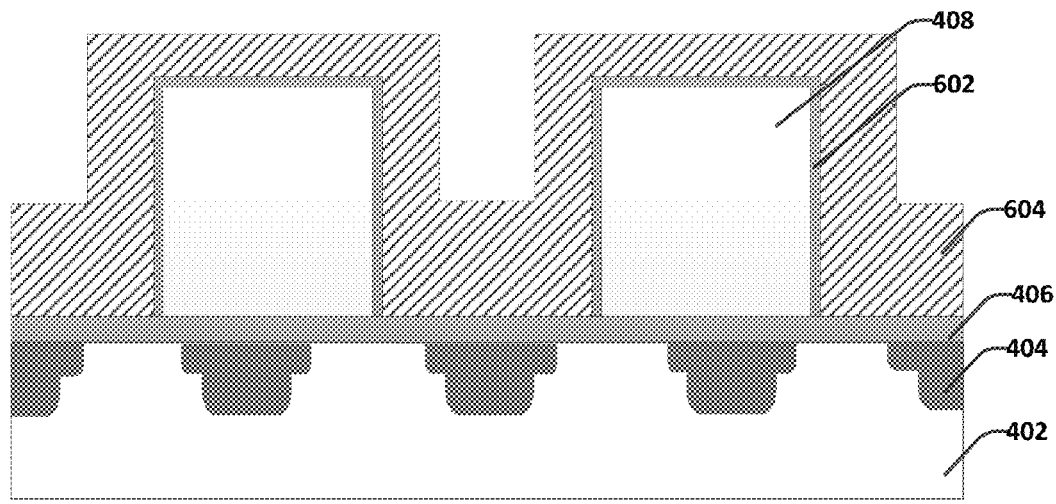

FIG. 6 illustrates a cross-sectional view 600 of another stage of forming split gate memory cells according to some embodiments of the present disclosure, after depositing or forming an oxide 602 over the sacrificial spacers 408 followed by deposition of the SG poly silicon 604.

Figure 7:
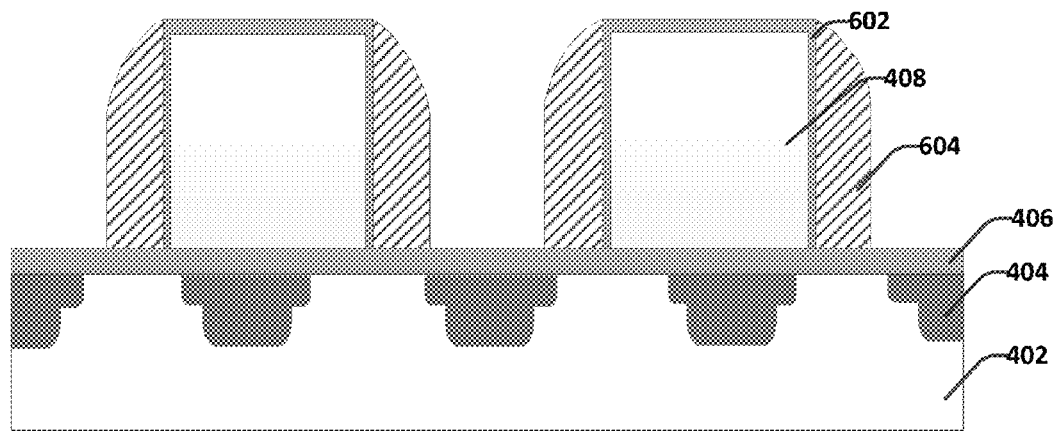

FIG. 7 illustrates a cross-sectional view 700 of another stage of forming split gate memory cells according to some embodiments of the present disclosure, wherein the SG poly silicon 604 is etched to form SG pairs on either side of the sacrificial spacer 408. In some embodiments, the SG poly silicon is etched off using wet etching without using a mask step.

Figure 8:
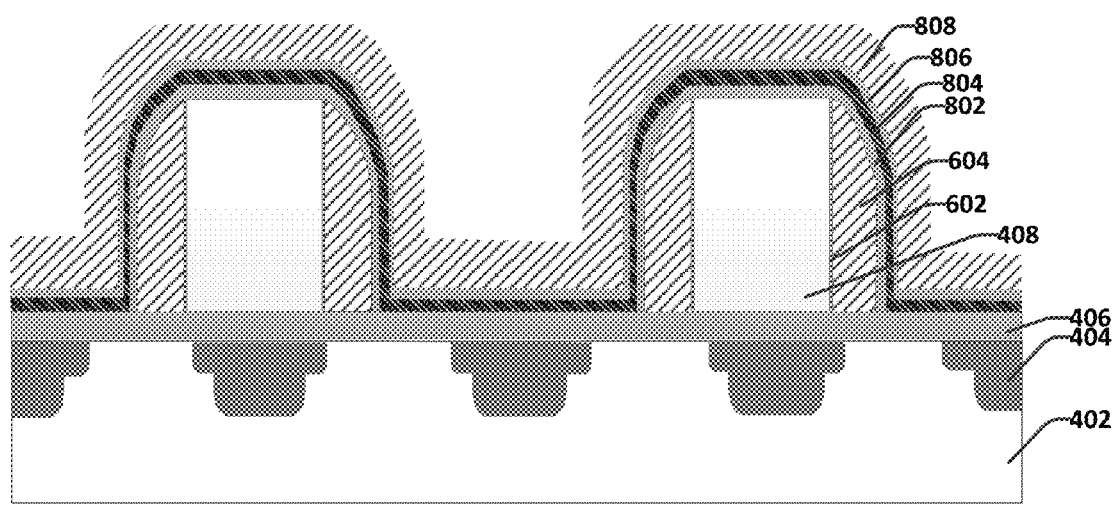

FIG. 8 illustrates a cross-sectional view 800 of another stage of forming split gate memory cells according to some embodiments of the present disclosure, after depositing an ONO (oxide-oxynitride-oxide) layer and the MG poly silicon 808 entirely over the oxide 406, sacrificial spacers 408 and the SGs 604. The first oxide layer of the ONO layer is represented by 802, the nitride layer is represented by 804 and the top oxide layer is represented by 806.

Figure 9:
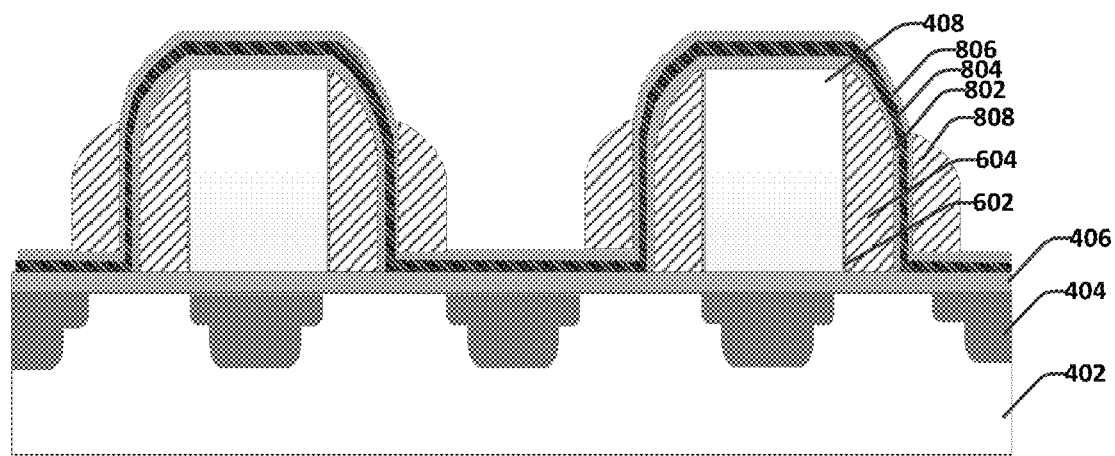

FIG. 9 illustrates a cross-sectional view 900 of another stage of forming split gate memory cells according to some embodiments of the present disclosure, after etching the MG poly silicon to form MGs 808 on either side of the sacrificial spacers 408. In some embodiments, the MG poly silicon is etched off using wet etching which stops at the top oxide layer 806, without using a mask step.

Figure 10:
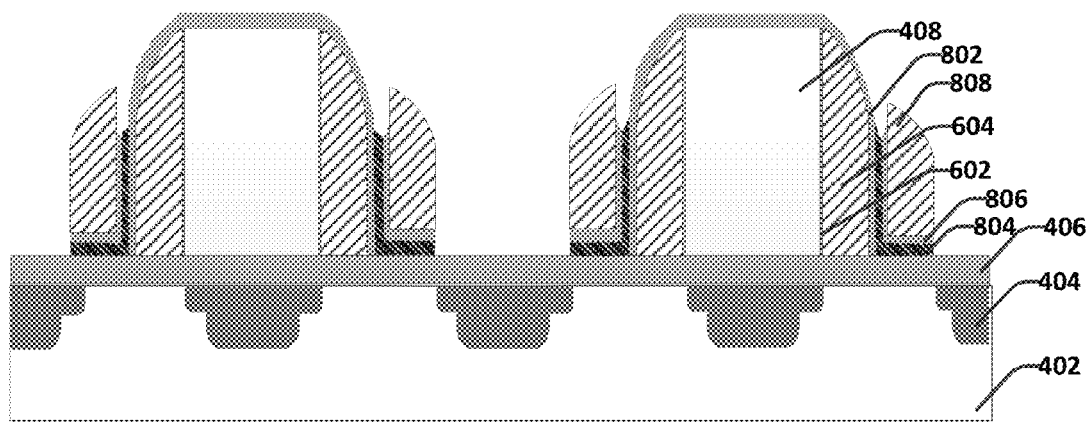

FIG. 10 illustrates a cross-sectional view 1000 of another stage of forming split gate memory cells according to some embodiments of the present disclosure, after etching the top oxide layer 806 and the nitride layer 804 of the ONO layer at specified location. In some embodiment wet etching, dry etching, plasma etching or reactive ion etching (RIE) is performed.

Figure 11:
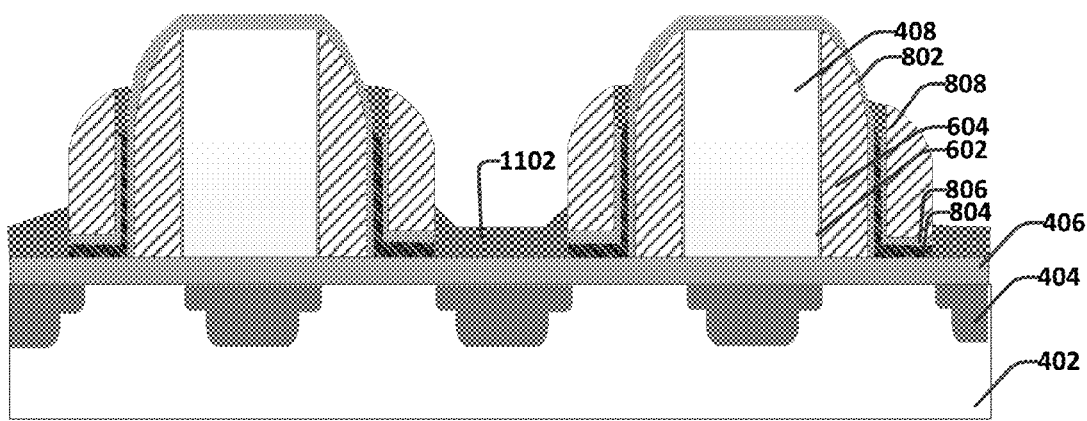

FIG. 11 illustrates a cross-sectional view 1100 of another stage of forming split gate memory cells according to some embodiments of the present disclosure, wherein a BARC layer 1102 is deposited at the oxide and nitride stripped areas. This layer protects the underlying layers in future etching steps.

Figure 12:
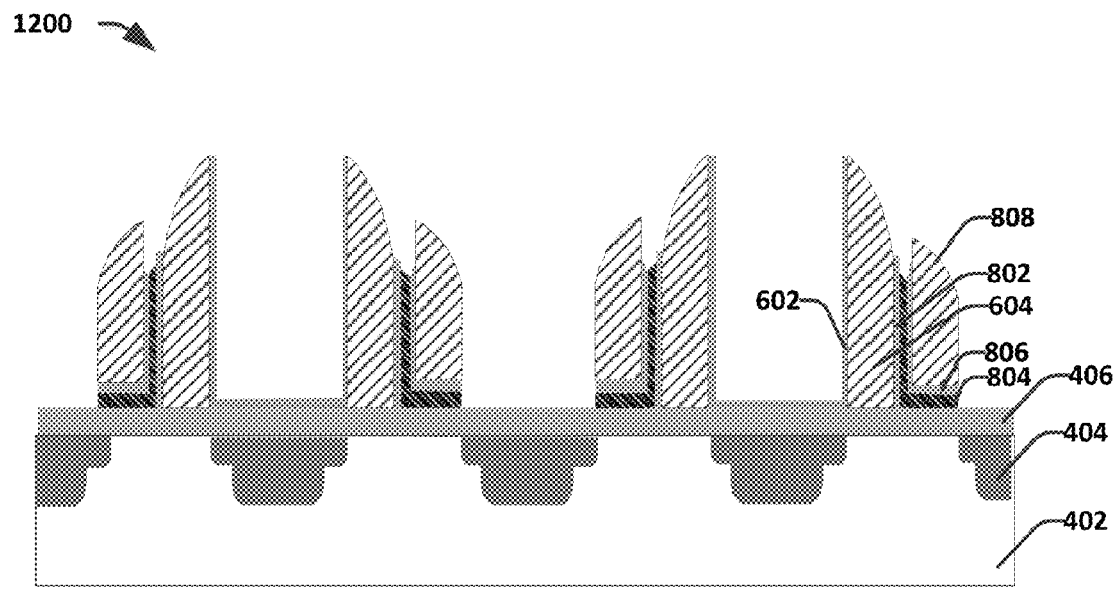

FIG. 12 illustrates a cross-sectional view 1200 of another stage of forming split gate memory cells according to some embodiments of the present disclosure, after removing the sacrificial spacers 408 and the oxide residing over the top surfaces of the sacrificial spacers and the gate structures. In some embodiments, the oxide and sacrificial spacers are removed using a wet etchant combination of HF+H3PO4.

Figure 13:
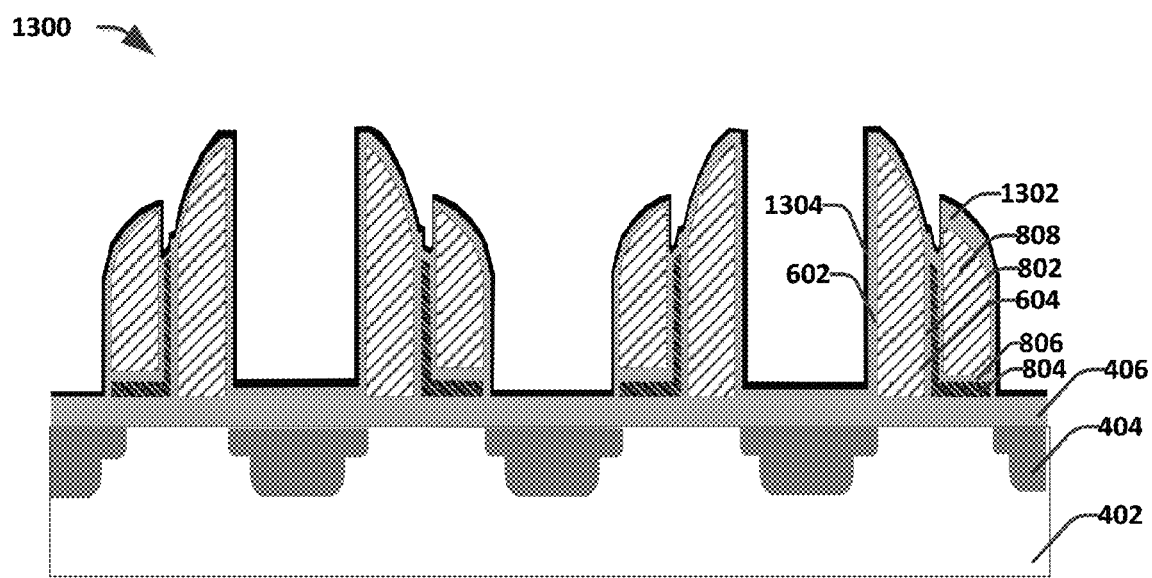

FIG. 13 illustrates a cross-sectional view 1300 of another stage of forming split gate memory cells according to some embodiments of the present disclosure, after depositing a main side wall spacer layer 1304 over the gate structures as well as over the oxide layer 404. Before depositing the spacer layer 1304, an oxide layer 1302 is deposited on the top surfaces of the gate structures. In some embodiments, the spacer layer comprises oxide+SiN.

Figure 14:
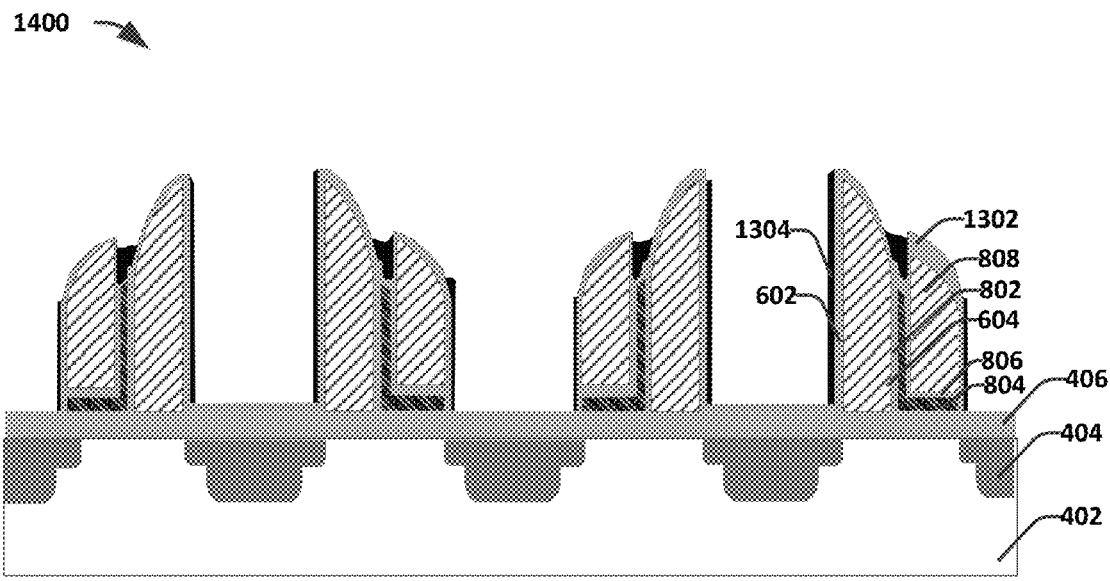

FIG. 14 illustrates a cross-sectional image 1400 of another stage of forming split gate memory cells according to some embodiments of the present disclosure, wherein the space layer 1304 is etched off from the top surface of the gate structures as well as from the oxide layer 406. The spacer layer 1304 is retained on the side walls of the MGs and the SGs as well as over the ONO layer in between the two adjacent SG-MG pairs.

Figure 15:
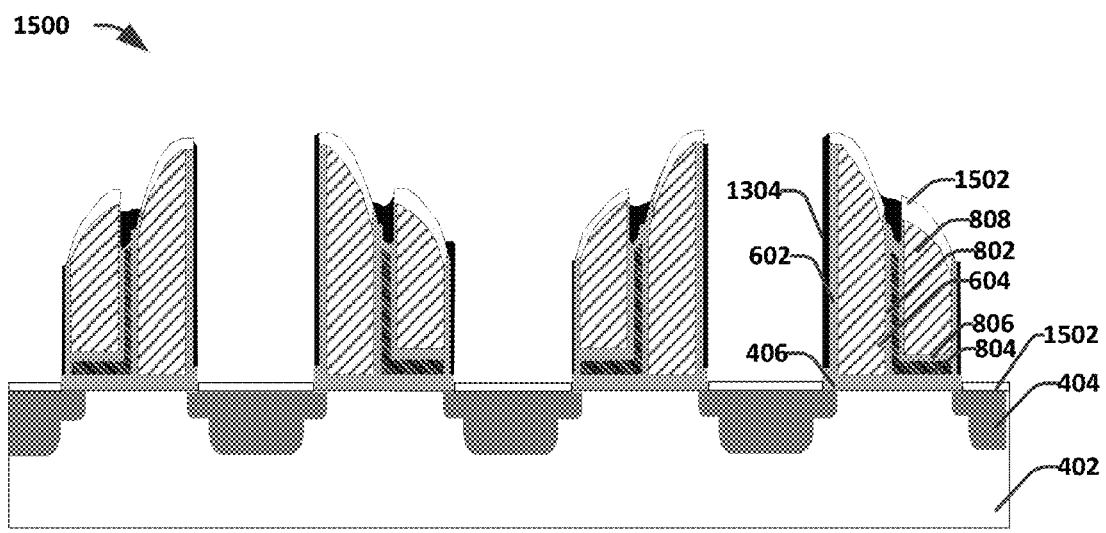

FIG. 15 illustrates a cross-sectional view 1500 of another stage of forming split gate memory cells according to some embodiments of the present disclosure, after removing a layer of oxide and depositing a salicide layer 1502. The oxide layer 406 is removed from the top of the semiconductor body 402 from areas between the gate structures and the oxide 1302 is removed from the non-planar top surfaces of the gate structures. Salicide layer 1502 is deposited in the above mentioned oxide stripped areas.

Figure 16:
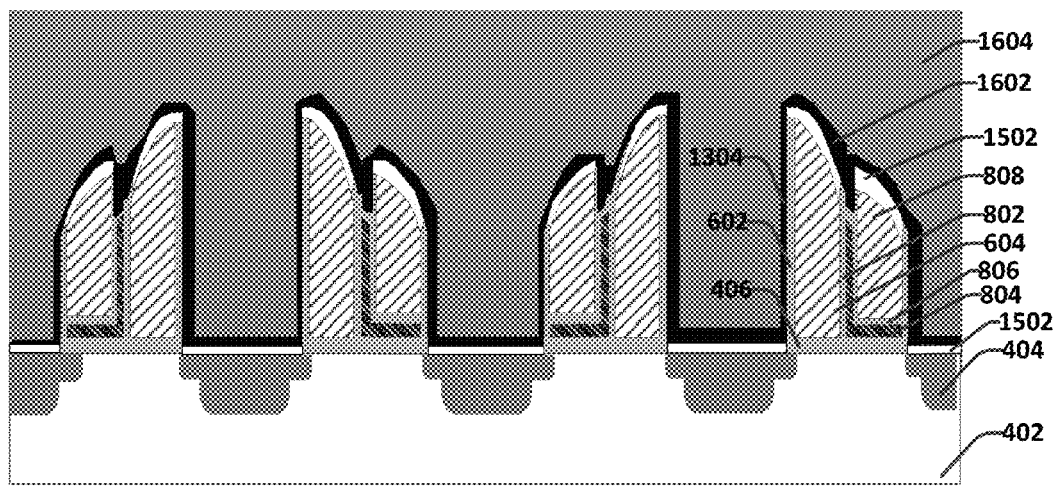

FIG. 16 illustrates a cross-sectional view 1600 of another stage of forming split gate memory cells according to some embodiments of the present disclosure, after depositing a contact etch stop layer (CESL) 1602 and interlayer dielectric 1604 entirely over the semiconductor body covering all the gaps. The inter-dielectric 1604 is planarized using a chemical mechanical polishing (CMP) process. In some embodiments, the CESL 1602 comprises SiN and the interlayer dielectric layer 1604 comprises BPTEOS.

Figure 17:
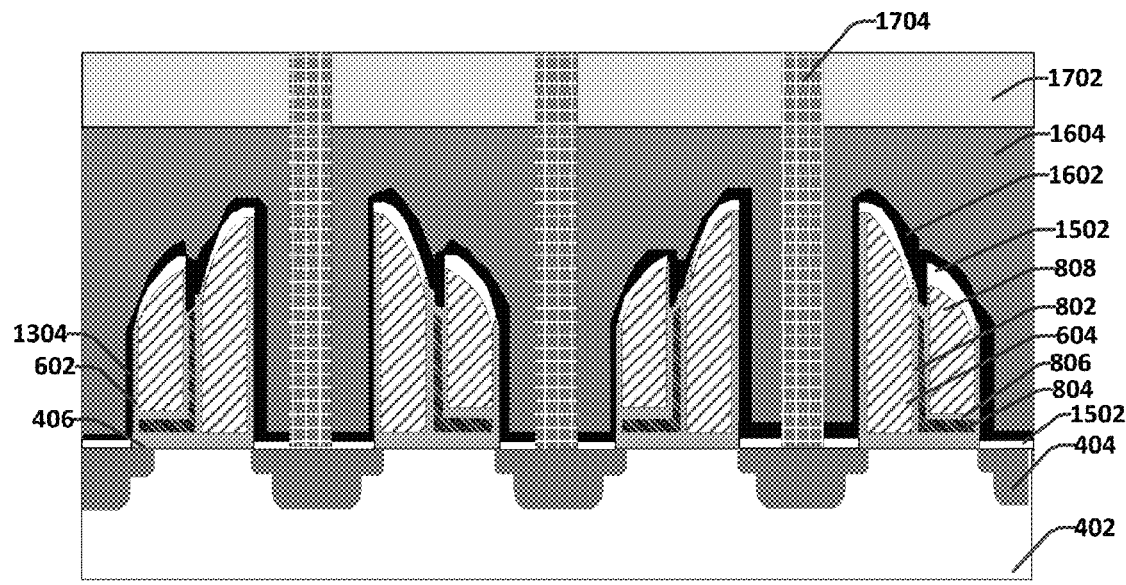

FIG. 17 illustrates a cross-sectional view 1700 of another stage of forming split gate memory cells according to some embodiments of the present disclosure, after depositing another top layer dielectric 1702 entirely over the inter layer dielectric 1604 to prevent H2O absorption, and forming metal contacts 1704 that extend downward to the source/drain (S/D) regions 404. In some embodiments, the top layer dielectric 1702 comprises TEOS and the metal contacts 1704 comprises Ti/TiN as a buffer layer which is filled with W.

Figure 18:
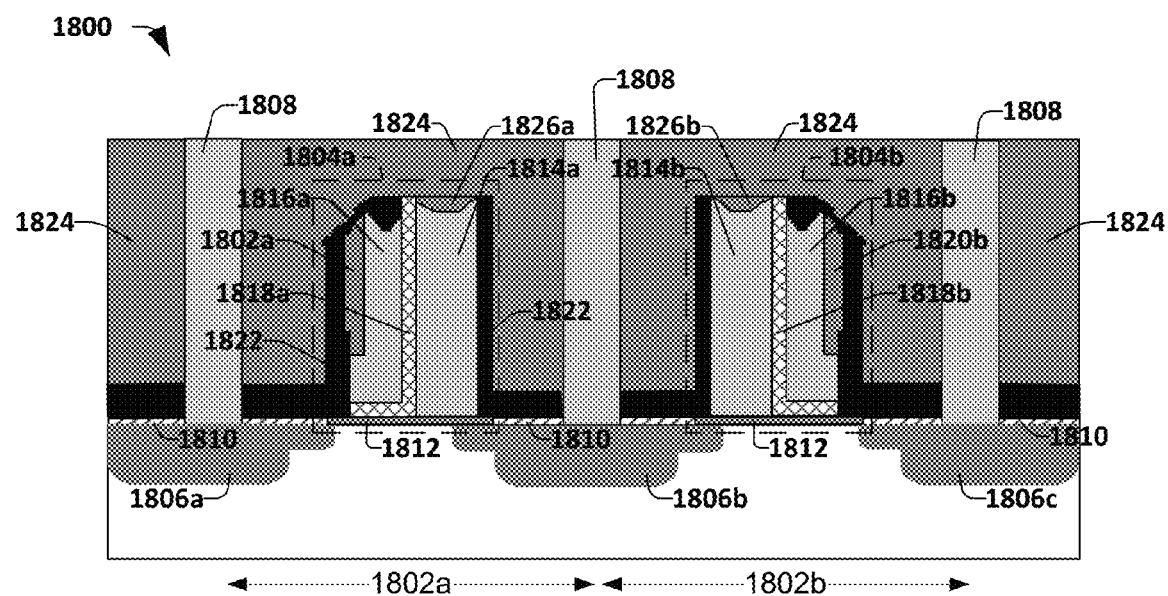
FIG. 18 shows a cross-sectional view of a pair of adjacent flash memory cells according to some embodiments of the present disclosure.

FIG. 18 shows a cross-sectional view of a semiconductor body that includes a pair of split gate flash memory cells 1800 in accordance with some embodiments. The pair of split gate flash memory cells 1800 includes a first memory cell 1802a and a second memory cell 1802b that resides over a semiconductor substrate 1801. The first and second memory cells 1802a, 1802b each include a memory cell gate structure that is arranged over a channel region separating source/drain regions of the memory cell. Thus, the first memory cell 1802a includes a first memory gate structure 1804a arranged between a first source/drain region 1806a and a second source/drain region 1806b; and the second memory cell 1802b includes a second memory gate structure 1804b arranged between the second source/drain region 1806b and a third source/drain region 1806c. The second source/drain region 1806b thus acts as a shared or common source/drain (S/D) region for the first and second memory cells 1802a, 1802b. Conductive contacts 1808, which can be made of Ti/TiN (titanium/titanium nitride) and/or W (tungsten) in some embodiments, extend downwardly to contact to silicide regions 1810 on upper regions of the source/drain regions 1806.

The memory gate structures 1804 are made of several sub-structures, including select gates, memory gates, and charge trapping layers, and have a memory gate lower surface that is separated from an upper surface of the semiconductor substrate by a base oxide 1812. More particularly, the first memory cell gate structure 1804a comprises a first select gate (SG) 1814a and a first memory gate (MG) 1816a; and the second memory cell gate structure 1804b comprises a second SG 1814b and a second MG 1816b. In some embodiments, the first and second SGs 1814a, 1814b and the first and second MGs 1816a, 1816b comprise doped poly silicon, however, in other embodiments the SGs and MGs can be made other conductive materials such as metal, for example. A charge-trapping layer 1818a is arranged between neighboring sidewalls of the first SG 1814a and first MG 1816a and extends under the first MG 1816a. Similarly, charge trapping layer 1818b and is arranged between neighboring sidewalls of the second SG 1814b and second MG 1816b and extends under the second MG 1816b. First and second dielectric sidewall spacers 1820a, 1820b abut outermost side walls of the first and second MGs 1816a, 1816b.

A CESL (contact etch-stop layer) 1822 conformally extends along inner opposing sidewalls of the SGs 1814a, 1814b, and also conformally extends along outermost sidewalls of the first and second sidewall spacers 1820a, 1820b.

The CESL 1822 can also extend over top surfaces of the first and second MG structures 1816a, 1816b and over the top surface of the semiconductor body on either side of the gate structures. An interlayer dielectric (ILD) layer 1824 resides above the CESL layer 1822.

As will be appreciated in greater detail below, first and second silicide-blocking caps 1826a, 1826b cover the upper surfaces of the first and second select gate structures 1814a, 1814b. The first and second silicide-blocking caps 1826a, 1826b prevent formation of silicides on the upper surfaces of the first and second SGs 1814a, 1814b to limit or prevent metal ion contamination during a CMP process associated with a replacement metal gate process of a HKMG process used for peripheral circuitry of the flash memory cell. In some embodiments, the first and second SGs 1814a, 1814b have respective top surfaces with first and second indentations, respectively, and the first and second silicide-blocking caps 1826a, 1826b are arranged in the first and second indentations, respectively.

In some embodiments, the first and second silicide-blocking caps 1826a, 1826b can be formed of the same material as the ILD layer 1824, however in other embodiments the silicide-blocking caps 1826a, 1826b can be made of a different material from the ILD layer 1824. For example, in some embodiments the ILD layer 1824 and the silicide-blocking caps 1826 can both be made out of silicon dioxide (SiO2), however, in other embodiments the silicide blocking caps 1826 can be made of SiO2 and the ILD layer 1824 can be made of a low-K dielectric material.

During operation, the first and second memory cells 1802a, 1802b can each be thought of as two transistors in series. Within each cell, one transistor is the memory gate transistor (e.g., corresponding to MG 1816a), and the other is the select gate transistor (e.g. corresponding to SG 1814a) which is controlled by a word line. Programming is performed by means of source-side channel hot-electron injection. Poly-to-poly Fowler-Nordheim (FN) electron tunneling is employed for erasing. To change the cell value to a "0", a negative electrical potential is applied to both the MG and SG transistors, such that the electrons stored in the charge-trapping layer (e.g., 1818a) are drained to the source side of the memory cell (e.g., 1806a or 1806b). The electrons in the cells of a chip can be returned to normal "1" by the application of a strong positive electric field. Because the electrons tend to remain in the charge-trapping layer even when power is disconnected from the chip, the flash memory cells are said to be "non-volatile."

Figure 19:
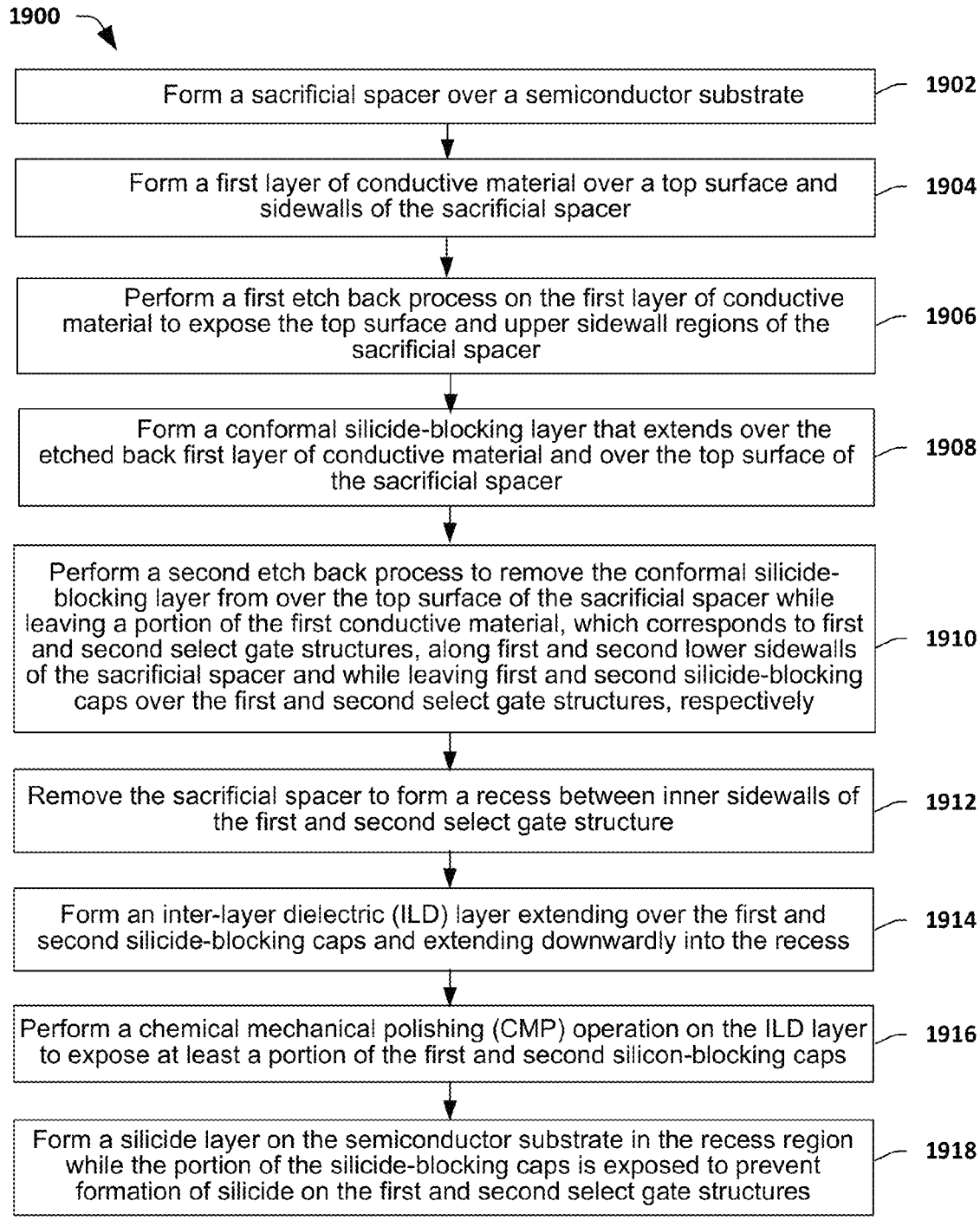
FIG. 19 shows a flow diagram of a method for forming a pair of self-aligned split gate flash memory cells according to some embodiments of the present disclosure.

FIG. 19 shows a flow diagram of a method 1900 according to some embodiments of the present disclosure. While disclosed method 1900 (and other methods described herein) is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1902, a sacrificial spacer, which includes sidewalls and a top surface, is formed over a semiconductor substrate.

At 1904, a first layer of conductive material is formed over the top surface and sidewalls of the sacrificial spacer.

In 1906, a first etch back process is performed on the first layer of conductive material to expose the top surface and upper sidewall regions of the sacrificial spacer. A portion of the first layer of conductive material is typically left to cover lower sidewall regions of the sacrificial spacer.

In 1908, a conformal silicide-blocking layer is formed. This conformal silicide-blocking layer extends over the etched back first layer of conductive material. The conformal silicide-blocking layer also extends over the top surface of the sacrificial spacer.

In 1910, a second etch back process is performed to remove the conformal silicide-blocking layer from over the top surface of the sacrificial spacer while leaving a portion of the first conductive material, which corresponds to first and second select gate structures, along first and second lower sidewalls of the sacrificial spacer. The second etch back process also leaves first and second silicide-blocking caps over the first and second select gate structures, respectively.

In 1912, the sacrificial spacer is removed to form a recess between opposing sidewalls of the first and second select gate structures.

In 1914, an inter-layer dielectric (ILD) layer is formed. This ILD layer extends over the first and second silicide-blocking caps and extends downwardly into the recess.

In 1916, a chemical mechanical polishing (CMP) operation is performed on the ILD layer to expose at least a portion of the first and second silicide-blocking caps.

In 1918, a silicide layer is formed on the semiconductor substrate in the recess region while the silicide-blocking caps are exposed. The exposed silicide-blocking caps prevent formation of silicide on the first and second select gate structures, while at the same time the silicide layer is formed over source/drain regions of the structure.

FIGS. 20-34 show a series of cross-sectional views at various stages of forming a split gate memory cell according to some embodiments of the present disclosure. It will be appreciated that although these cross-sectional views illustrate only a pair of split-gate memory cells, in typical embodiments an integrated circuit will include thousands, millions, billions, or even greater numbers of such split gate memory cells arranged in a memory array. The final integrated circuit also includes peripheral circuitry that can utilize different process layers (e.g., HKMG and/or replacement metal gate technology), such as are used in CMOS processes. Integration of the split-gate memory cells and the peripheral circuitry has caused a number of integration and reliability issues, which are mitigated in the process flow set forth below.

Figure 20:
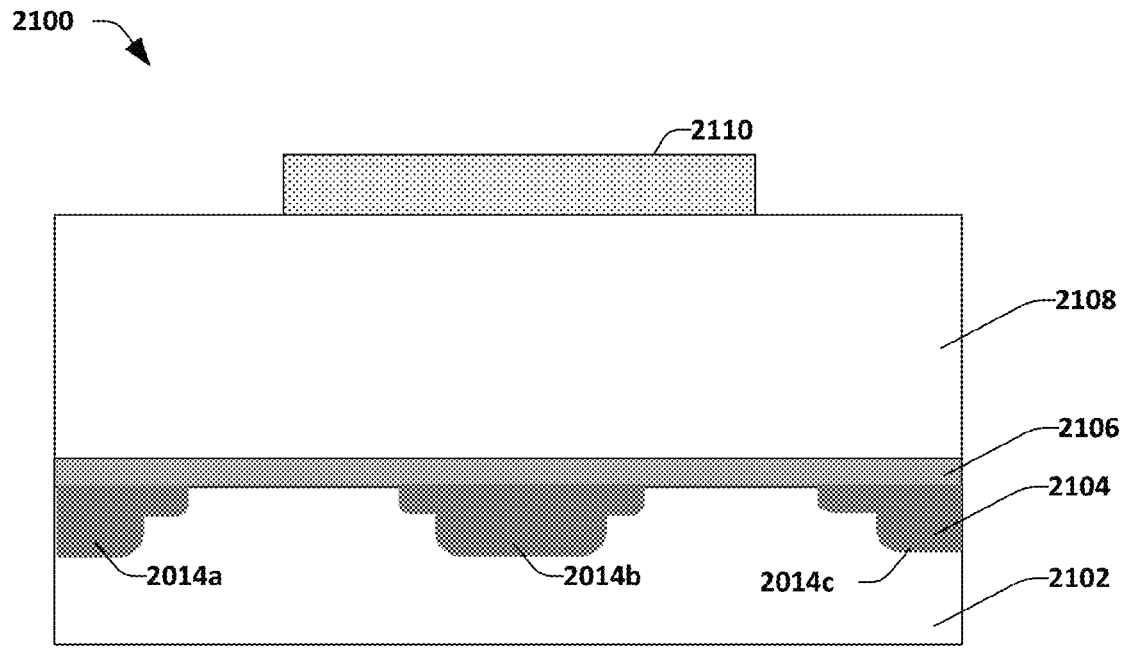
FIGS. 20-34 show a series of cross-sectional views at various stages of forming a split gate memory cell according to some embodiments of the present disclosure.

FIG. 20 illustrates a cross-sectional view of a semiconductor body 2100 at one of the stages of forming split gate memory cells according to some embodiments of the present disclosure. The semiconductor body 2100 includes a semiconductor substrate 2102 on which memory devices and peripheral devices (e.g., CMOS devices) are formed. In some embodiments, the semiconductor substrate 2102 can be a bulk silicon substrate, a silicon on insulator (SOI) substrate, a binary semiconductor substrate (e.g., GaAs), tertiary semiconductor substrate (e.g., AlGaAs), or higher order semiconductor substrate, for example. Any of these substrates can include doped regions formed in the substrate, one or more insulating layers formed in or on the substrate, and/or conducting layers formed in or on the substrate.

The illustrated semiconductor substrate 2102 has source/drain regions 2104 that are formed, for example, by ion implantation or out-diffusion of dopants. A base dielectric layer 2106, such as an oxide layer or a high-k gate dielectric, resides on top of the semiconductor substrate 2102 and can help protect the semiconductor body during future etching steps. Over the base dielectric layer 2106, a layer of sacrificial spacer material 2108 is formed. In some embodiments, the sacrificial spacer material comprises SiN, SiC and/or SiO2. A mask 2110, such as a layer of patterned photoresist for example, is formed on top of the sacrificial spacer material 2108.

Figure 21:
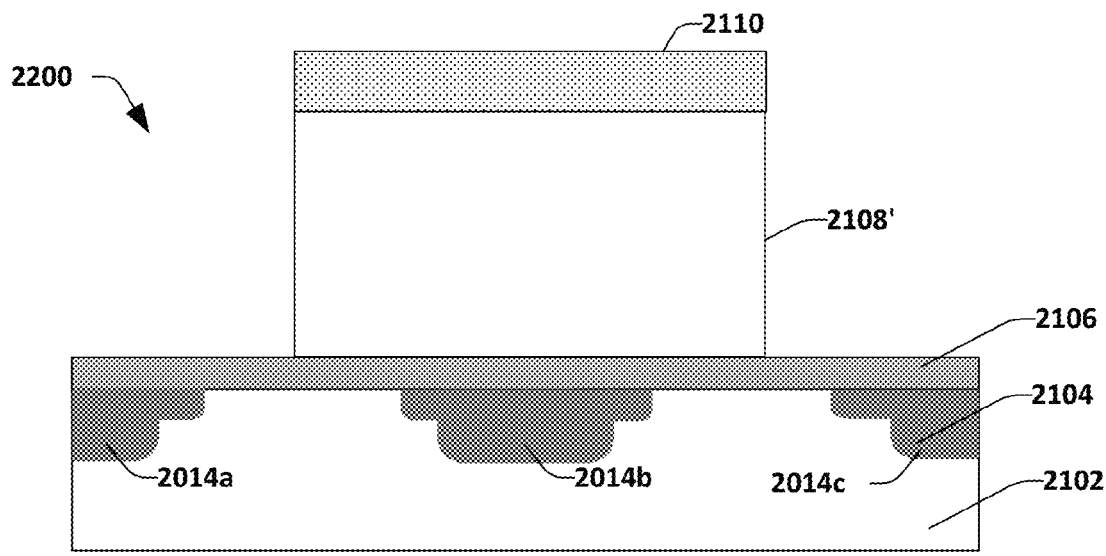

FIG. 21 illustrates a cross-sectional view of a semiconductor body 2200, after the sacrificial spacer material 2108 has been patterned with the mask 2110 in place to form a sacrificial spacer 2108' having sidewalls and top surface. In some embodiments the sacrificial spacer 2108' may be formed by carrying out either a plasma or reactive ion etch (RIE) or a selective wet etch while the mask 2110 is in place. A source/drain region 2104b, which covered by the patterned sacrificial spacer, is a common or shared source/drain region, while other source/drain regions 2104a, 2104c, which are left uncovered by the patterned sacrificial spacer, can correspond uniquely to a different split gate memory cells. After the sacrificial spacer 2108' is patterned, the mask 2110 can be removed.

Figure 22:
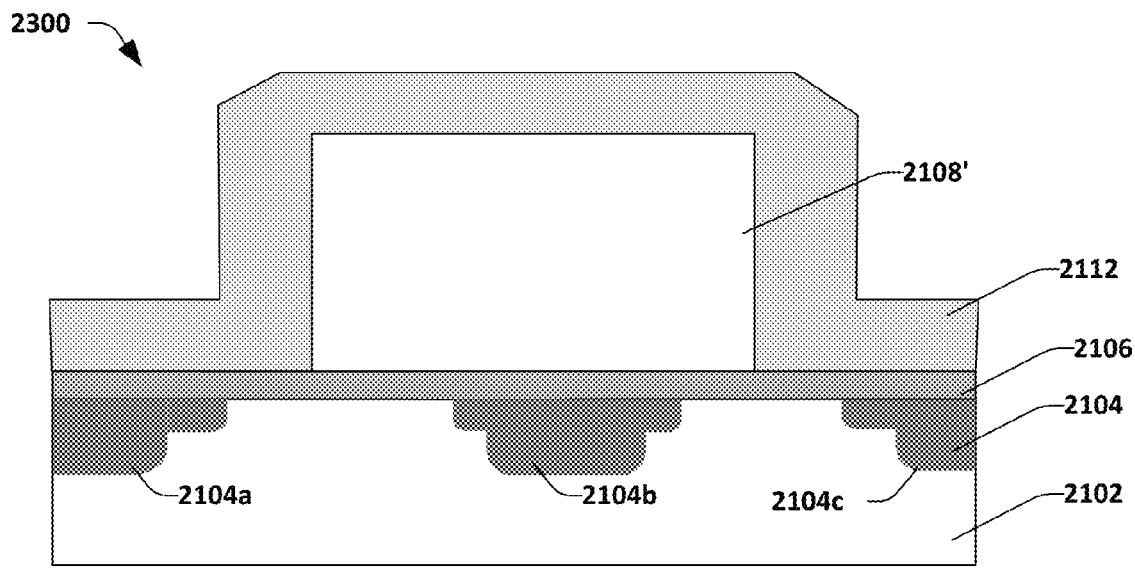

FIG. 22 illustrates a cross-sectional view of a semiconductor body 2300, after forming a first layer of conductive material 2112 over the base dielectric 2106 as well as over the sacrificial spacer 2108. As will be appreciated further herein, this first layer of conductive material 2112 will later correspond to select gate structures, and can be made of doped polysilicon in some embodiments. In other embodiments, the first layer of conductive material 2112 can be a metal layer.

Figure 23:
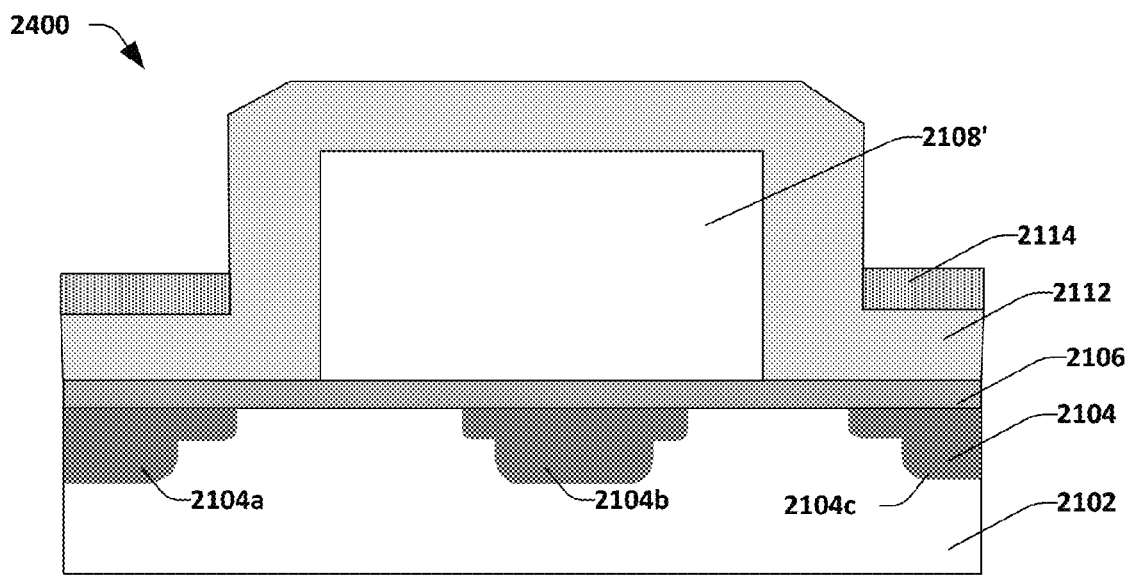

FIG. 23 illustrates a cross-sectional view of a semiconductor body 2400, after depositing an etch protection layer 2114 on regions of the substrate not covered by the patterned sacrificial spacer 2108'. Thus, the etch protection layer 2114 can be formed on either side of the sacrificial spacer 2108' to protect covered regions of the first conductive layer 2112 from an upcoming etch-back process. In some embodiments, the etch protection layer 2114 comprises a BARC (bottom anti-reflective coating) material.

Figure 24:
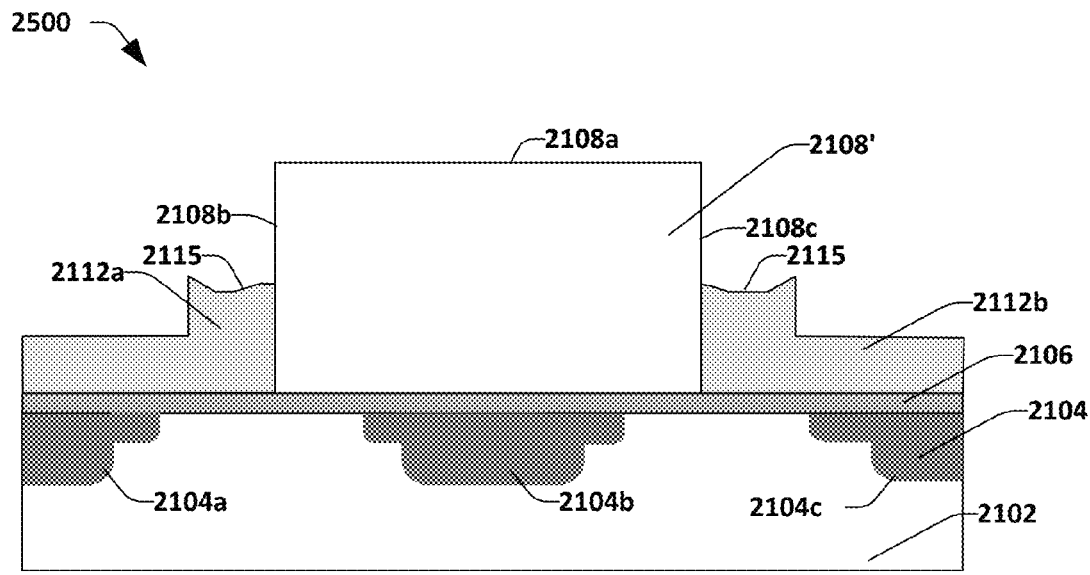

FIG. 24 illustrates a cross-sectional view of after performing a first etch-back process on the first layer of conductive material 2112. The first etch-back process removes portions of the first conductive layer 2112 to expose the top surface 2108a and upper sidewall regions 2108b, 2108c of the sacrificial spacer. Thus, the first etch-back process leaves portions 2112a, 2112b of the first conductive layer covering lower sidewall regions of the sacrificial spacer 2108'. After etching, height of the first conductive layer can be reduced to approximately half of a height level of the sacrificial spacer 2108'. In some embodiments, the remaining portion of the first conductive layer has top surfaces 2115 that have a curved geometry with an indention in a central region thereof. The etch protection layer 2114 protects the first layer of conductive material over the source/drain regions and is removed after the first etch-back process.

Figure 25:
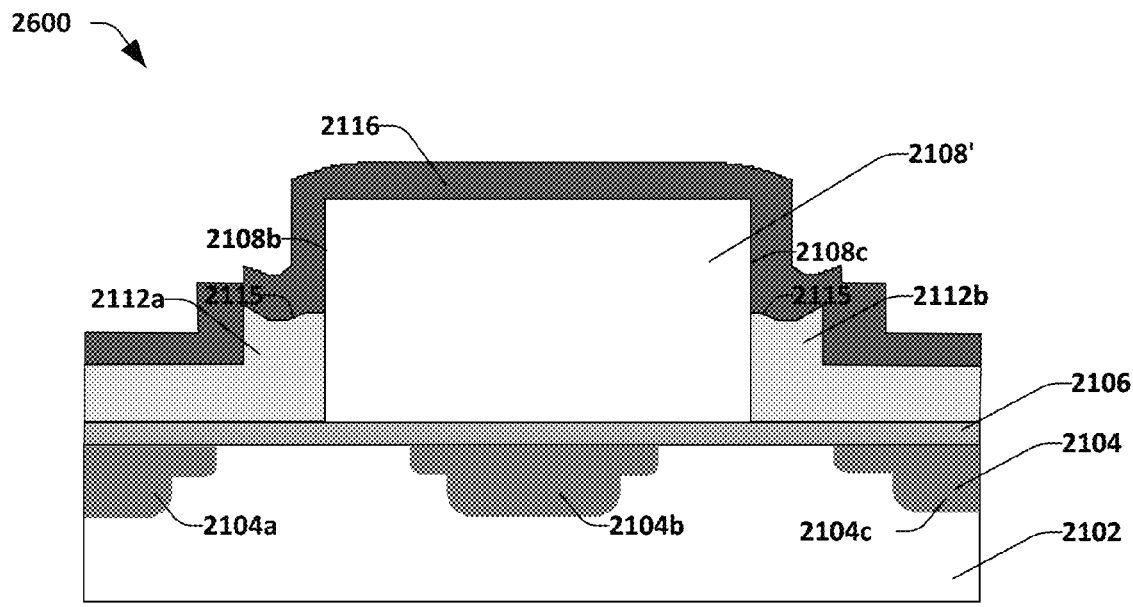

FIG. 25 illustrates a cross-sectional view after a conformal silicide-blocking layer 2116 has been formed. The silicide-blocking layer 2116 extends over the top surfaces 2115 of the remaining portion of the first layer of conductive material, and also extends over the top surface 2108a and upper sidewall regions 2108b, 2108c of the sacrificial spacer 2108'. In some embodiments, the silicide-blocking layer 2116 comprises SiO2 (silicon dioxide).

Figure 26:
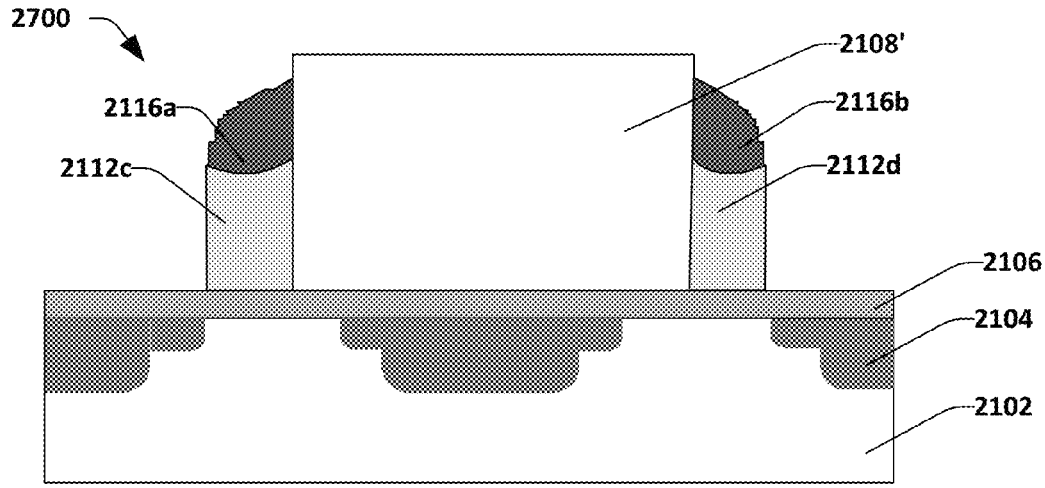

FIG. 26 illustrates a cross-sectional view of a semiconductor body 2700, after a second etch back procedure has been performed. This second etch back procedure etches away the portions of the first conductive layer 2112 over the source/drain regions; and also removes the silicide-blocking layer from over the top surface of the sacrificial spacer. Thus, the second etch back process results in first and second silicide-blocking caps 2116a, 2116b that are arranged over first and second select gates 2112c, 2112d. In some embodiments, the second etch back process comprises a wet etch, but could also be a dry etch, such as a plasma etch or RIE procedure.

Figure 27:
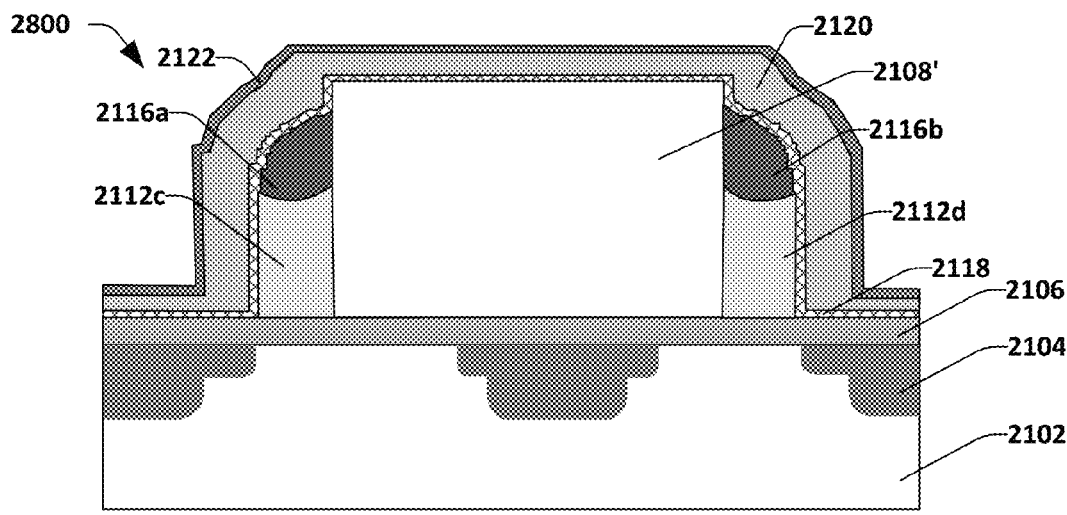

FIG. 27 illustrates a cross-sectional view of a semiconductor body 2800, after forming a charge-trapping layer 2118, a second conductive material layer 2120 and a dielectric spacer layer 2122 over the entire semiconductor body 2102. In some embodiments, the second conductive layer 2120 comprises poly silicon and the dielectric spacer layer 2122 comprises SiO2.

Figure 28A:
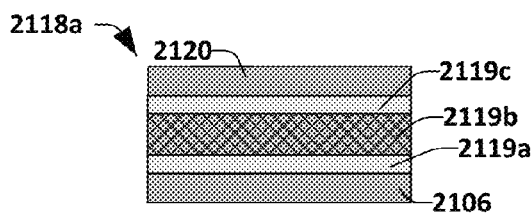

FIG. 28a illustrates a cross sectional view of an embodiment of charge-trapping layer 2118. In this example, charge-trapping layer 2118a comprises a first oxide layer 2119a, a nitride layer 2119b, and a second oxide layer 2119c. During operation of the memory cell, the first and/or second oxide layers 2119a, 2119c are structured to promote electron tunneling to and from the nitride layer 2119b, such that the nitride layer 2119b can retain trapped electrons that alter the threshold voltage of the cell in a manner that corresponds to a data state stored in the cell.

Figure 28B:
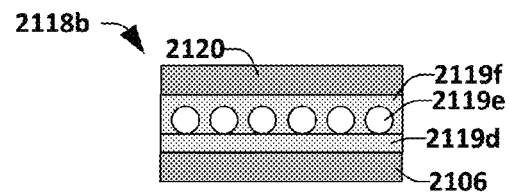

FIG. 28b illustrates a cross sectional view of an alternate embodiment of charge-trapping layer 2118. In this example, charge-trapping layer 2118b comprises a first oxide layer 2119d, a layer of silicon dots 2119e, and a second oxide layer 2119f. During operation of the memory cell, the first and/or second oxide layers 2119d, 2119f are structured to promote electron tunneling to and from the layer of silicon dots 2119e, such that charge can become trapped on the silicon dots and alter the threshold voltage of the cell in a manner that corresponds to a data state stored in the cell. In some embodiments, the Si dots have diameters ranging from approximately 5 nm to approximately 20 nm.

Figure 29:
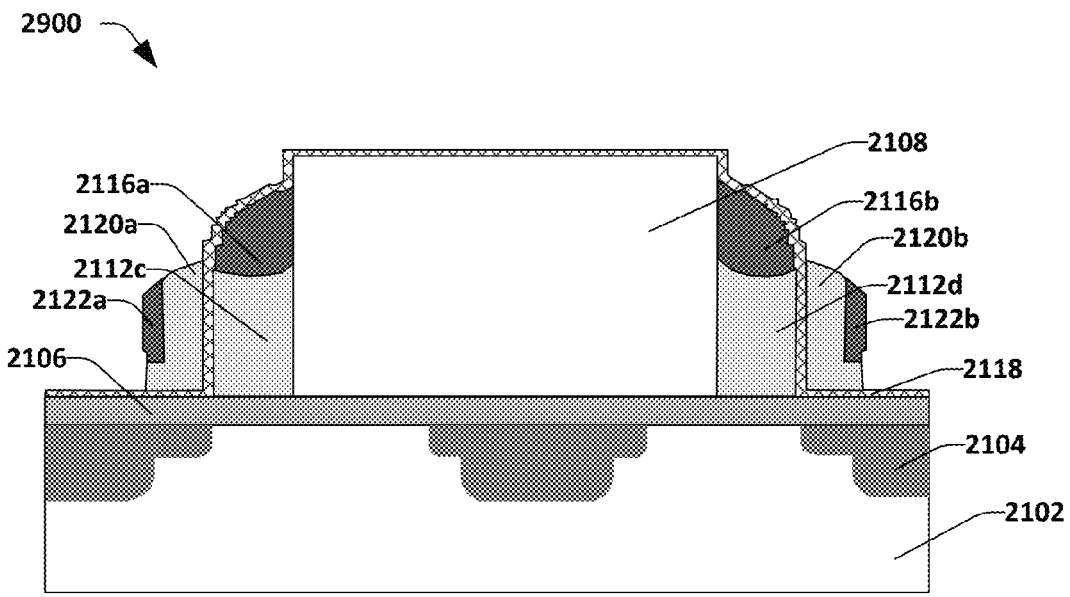

FIG. 29 illustrates a cross sectional view of a semiconductor body 2900, after etching parts of the oxide layer 2122 and the second conductive layer 2120 to form a pair of MGs 2120a, 2120b on either side of the sacrificial spacer 2108 adjacent the outer side walls of SGs 2112c and 2112d. Dielectric sidewall spacers 2122a, 2122b are also formed, being made out of oxide, for example. The MGs 2120a, 2120b extend under the dielectric spacers 2122a, 2122b. In some embodiments, the second conductive layer 2120 and the dielectric spacer layer 2122 are etched off using wet etching.

Figure 30:
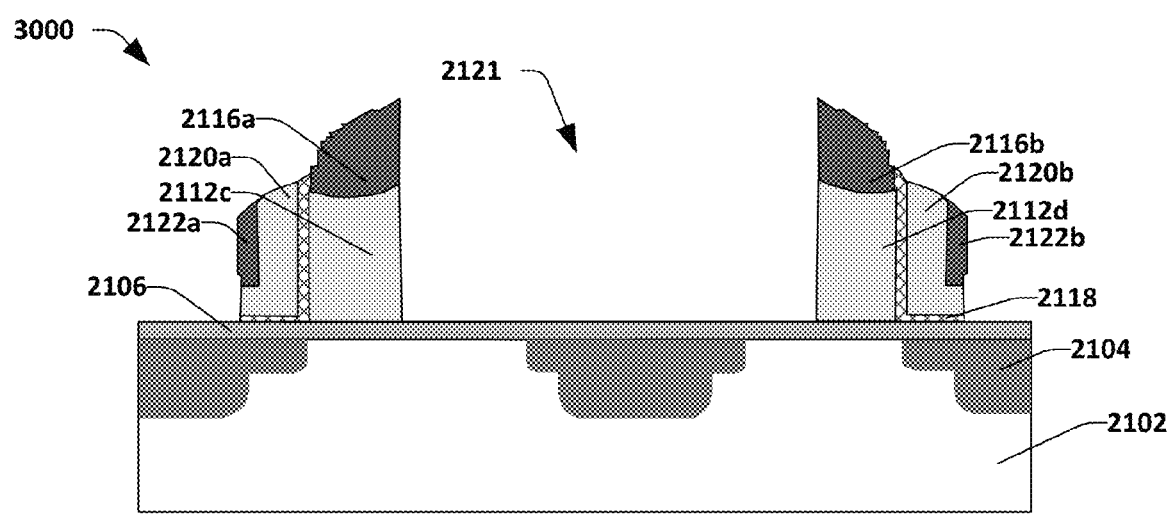

FIG. 30 illustrates a cross sectional view of a semiconductor body 3000, after removing exposed parts of the charge-trapping layer 2118 and the sacrificial spacer 2108 to form a recess 2121. This etching exposes the base dielectric layer 2106 in regions where there are no SGs or MGs. In some embodiments, the charge-trapping layer 2118 and the sacrificial spacer 2108 are removed using a wet etchant combination of HF+H3PO4.

Figure 31:
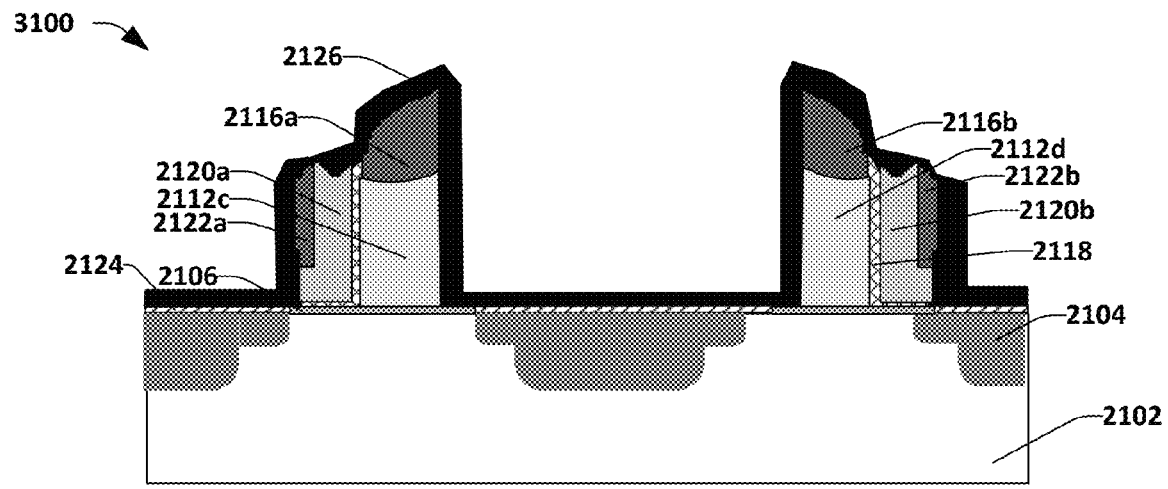

FIG. 31 illustrates a cross sectional view of a semiconductor body 3100, after etching away exposed regions of the base dielectric layer 2106, forming a salicide 2124 on upper regions of the source/drain regions, performing an etch-back process on the top surfaces of the MGs 2120a and 2120b, while a BARC layer (not shown) overlies the salicide layer 2124 and protects the rest of the semiconductor body, and forming a CESL layer 2126 encapsulating the gate structures and the base of the semiconductor body 2102. In some embodiments, the salicide layer 2124 comprises NiSi and the CESL layer comprises SiN and the dielectric sidewall spacers 2122a and 2122b comprise a nitride. The etch back process performed on the MGs gives a non-planar/curved geometry for their top surfaces and makes sure the MG poly layer is protected with the CESL layer from future polishing steps.

Figure 32:
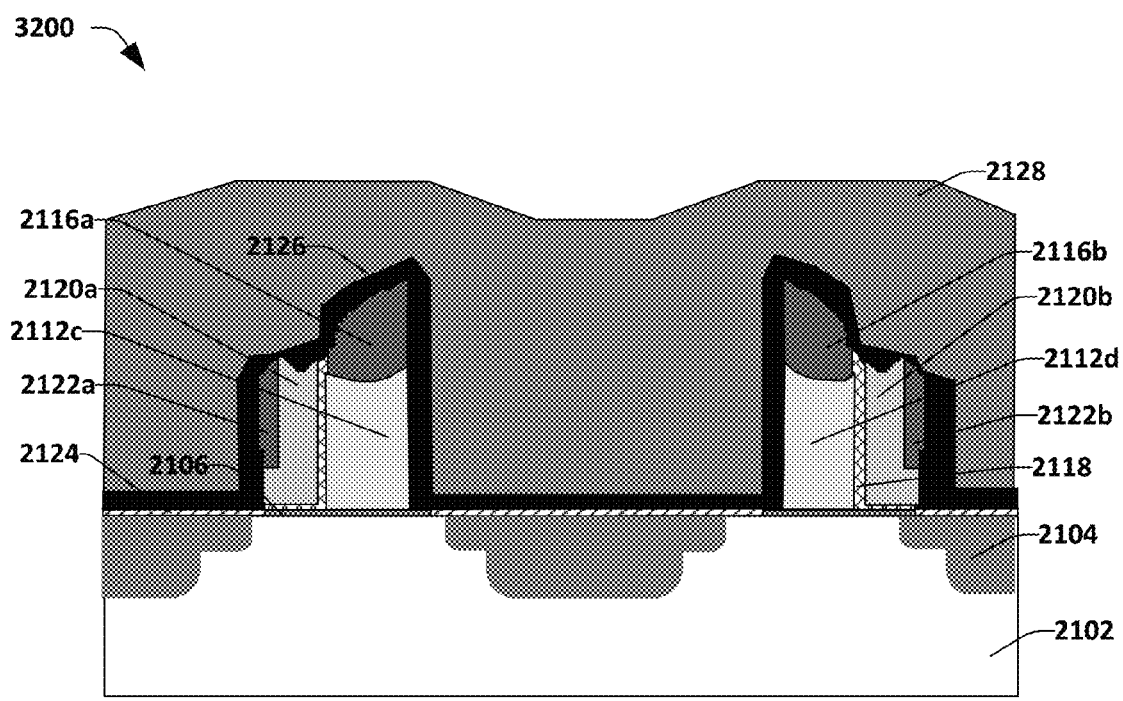

FIG. 32 illustrates a cross sectional view of a semiconductor body 3200, after depositing an ILD layer 2128 entirely over the semiconductor body. In some embodiments, the ILD layer 2128 comprises SiO2 or TEOS (tetetraethylorthosilicate), but the ILD layer can also be a low-k dielectric with a dielectric constant of less than about 2.8.

Figure 33:
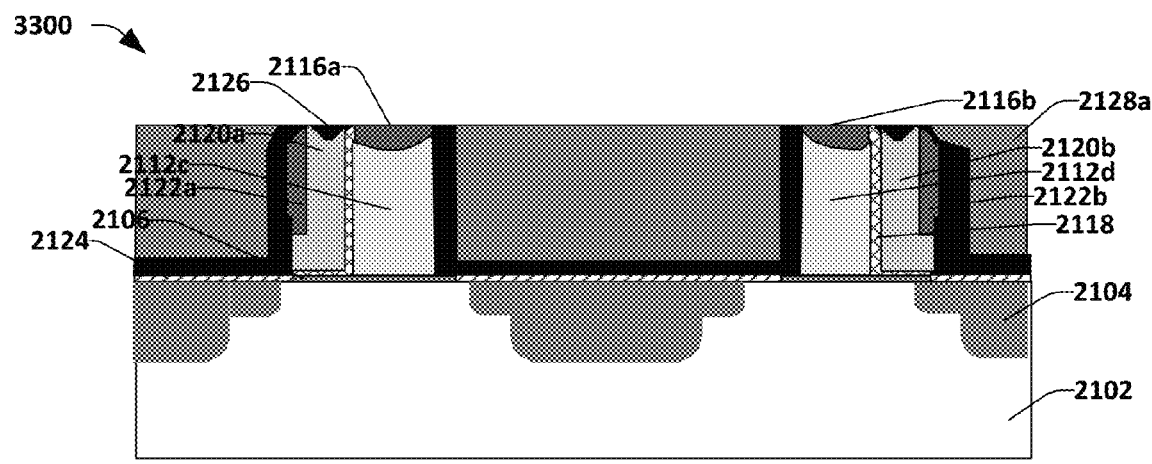

FIG. 33 illustrates a cross sectional view of a semiconductor body 3300, after performing a CMP (chemical mechanical polishing) on the ILD layer 2128. This CMP process polishes until a height level of the CESL layer on top of the MG is reached, and thus reduces height of the SG structures (SG with protective dielectric on top) to that level. Semiconductor body 3300 has a planar top surface that exposes part of the silicide-blocking layer over the SGs (2116a and 2116b), part of the CESL layer 2126 over the MGs and portions of charge-trapping layer 2118 in between the SGs and the MGs at that height level.

Figure 34:
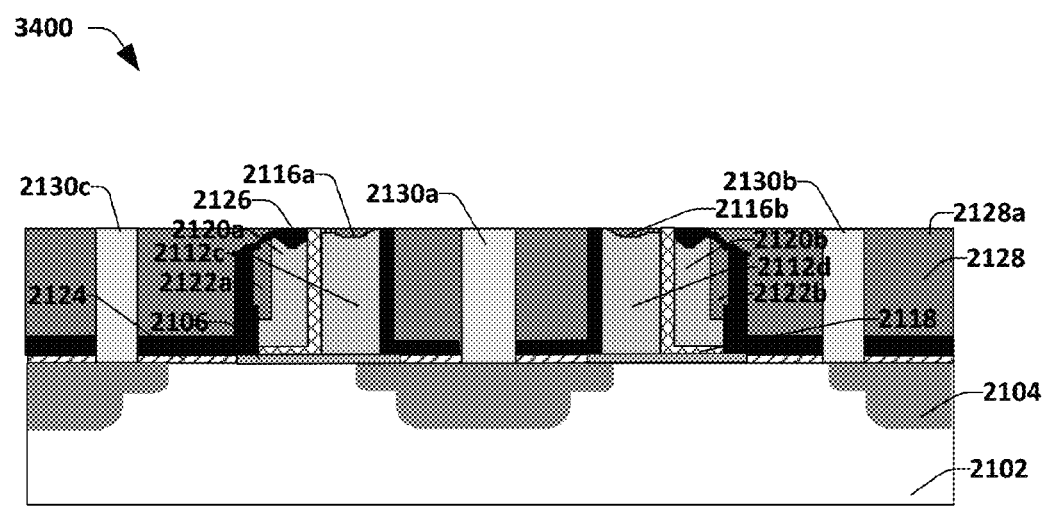

FIG. 34 illustrates a cross sectional view of a semiconductor body 3400, after forming metal contacts 2130a-2130c. Metal contacts 2130a-2130c extend downward to the silicides on upper portion of source/drain (S/D) regions 2104, and can comprise Ti/TiN as a buffer layer which is filled with W in some embodiments.

It will be appreciated that while reference is made throughout this document to exemplary structures in discussing aspects of methodologies described herein that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

The present disclosure relates to a structure and method for forming self-aligned split gate flash memory cells that can be embedded with a N28 (28 nm) technology or beyond. The self-aligned flash memory formed around the sacrificial spacer provides precise control of the SG and MG critical dimension and thus improves shrink capability. The top surfaces of the SG and MG of each flash memory cell has a curved geometry which when filled with dielectrics, provides protection during salicide formation. The absence of salicide prevents metal ion contamination during the CMP process associated with HKMG integrated circuit. Thus, the method is also compatible with RMG process.

In some embodiments, the present disclosure relates to a method of forming a split gate memory cell over a semiconductor substrate. In this method, a sacrificial spacer is formed over a semiconductor substrate. A first layer of conductive material is formed over a top surface and sidewalls of the sacrificial spacer. A first etch back process is formed on the first layer of conductive material to expose the top surface of the sacrificial spacer and upper sidewall regions of the sacrificial spacer. A conformal silicide-blocking layer is then formed which extends over the etched back first layer of conductive material and over the top surface of the sacrificial spacer.

In other embodiments, a split gate memory device is disposed over a semiconductor substrate. The devices includes a common source/drain region disposed in the semiconductor substrate, and first and second select gate structures arranged on opposite sides of the common source drain. First and second silicide-blocking caps are arranged on upper surfaces of the first and second select gate structures, respectively.

Still other embodiments relate to a split gate memory device disposed over a semiconductor substrate. The split gate memory device includes a first memory gate (MG) and a first select gate (SG). The first SG have a top surface covered by a first silicide-blocking cap. A first dielectric spacer abuts a first portion of an outer sidewall of the first MG. The first MG extends under the first dielectric spacer. A first charge-trapping layer is arranged between neighboring sidewalls of the first MG and the first SG. The first charge-trapping layer extends under the first MG.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A split gate memory device disposed over a semiconductor substrate comprising:
a common source/drain region disposed in the semiconductor substrate;
first and second select gate structures arranged on opposite sides of the common source/drain region;
first and second silicide-blocking caps comprising a first material on upper surfaces of the first and second select gate structures, respectively;
first and second memory gate structures arranged on an opposite side of the first and second select gate structures as the common source/drain region, respectively;
a first contact etch stop layer (CESL) comprising a second material and covering an inner sidewall of the first select gate structure facing the common source/drain region, an outer sidewall of the first memory gate structure facing away from the common source/drain region, and an upper surface of the first memory gate structure; and
a second CESL comprising the second material and covering an inner sidewall of the second select gate structure facing the common source/drain region, an outer sidewall of the second memory gate structure facing away from the common source/drain region, and an upper surface of the second memory gate structure.

2. The split gate memory device of claim 1, wherein the first and second select gate structures have respective first and second top surfaces with first and second indentations, respectively, and wherein the first and second silicide-blocking caps are arranged in the first and second indentations, respectively, and completely cover the upper surfaces of the first and second select gate structures.

3. The split gate memory device of claim 1, further comprising:
a base oxide layer separating lower surfaces of the first and second select gate structures from an upper surface the semiconductor substrate;
first and second sidewall spacers abutting outermost sidewalls the first and second memory gate structures, respectively, wherein the first and second memory gate structures extend under the first and second sidewall spacers.

4. The split gate memory device of claim 3, further comprising:
a silicide layer extending over a base surface of the semiconductor substrate on either side of the first and second select gate structures.

5. The split gate memory device of claim 3, further comprising:
a charge-trapping layer arranged between neighboring sidewalls of the first memory gate structure and the first select gate structure and extending under the first memory gate structure.

6. The split gate memory device of claim 5, wherein the charge-trapping layer comprises:
a first dielectric layer;
a layer of sphere-like silicon dots arranged over a surface of the first dielectric layer; and
a second dielectric layer arranged over the layer of sphere-like silicon dots.

7. The split gate memory device of claim 4, wherein the first CESL covers an upper surface of the first sidewall spacer, and the second CESL covers an upper surface of the second sidewall spacer.

8. A split gate memory device disposed over a semiconductor substrate comprising:
a first memory gate (MG) and a first select gate (SG), the first SG having a top surface covered by a first silicide-blocking cap;
a first dielectric spacer abutting a first portion of an outer sidewall of the first MG facing away from the first SG, wherein the first MG extends under the first dielectric spacer;
a first charge-trapping layer arranged between neighboring sidewalls of the first MG and the first SG, the first charge-trapping layer extending under the first MG; and
a first contact etch stop layer contacting a second portion of the outer sidewall of the first MG and the first dielectric spacer.

9. The split gate memory device of claim 8,
a second memory gate (MG) and a second select gate (SG), the second SG having a top surface covered by a second silicide-blocking cap;
a second dielectric spacer abutting an outer sidewall of the second MG, wherein the second MG extends under the second dielectric spacer; and
a second charge-trapping layer arranged between neighboring sidewalls of the second MG and the second SG, the second charge-trapping layer extending under the second MG.

10. The split gate memory device of claim 9, further comprising:
a common source/drain region arranged between the first and second select gates and having a silicide on an upper region thereof.

11. The split gate memory device of claim 8, wherein the top surface of the first select gate comprises a concave depression that extends between sidewalls of the first select gate and causes a center of the top surface to be below outer edges of the top surface.

12. The split gate memory device of claim 11, wherein the first silicide-blocking cap has a substantially planar upper surface and a curved lower surface contacting the top surface of the first select gate.

13. The split gate memory device of claim 12, wherein the substantially planar upper surface of the first silicide-blocking cap is co-planar with a substantially planar upper surface of the first charge-trapping layer.

14. The split gate memory device of claim 8, wherein the first contact etch stop layer contacts a sidewall of the first dielectric spacer.

15. The split gate memory device of claim 14,
wherein a top surface of the first memory gate comprises a concave depression that causes a center of the top surface to be below outer edges of the top surface; and
wherein the top surface of the first memory gate abuts the first contact etch stop layer.

16. The split gate memory device of claim 8, wherein the first memory gate comprises an 'L' shaped structure with a vertical segment and a horizontal segment, wherein an upper surface of the vertical segment comprises a depression extending between sidewalls of the vertical segment.

17. A memory cell, comprising:
a common source/drain region arranged within a substrate;
a first source/drain region arranged within the substrate and separated from the common source/drain region by a first channel region;
a first select gate arranged over the first channel region, wherein an upper surface of the first select gate comprises a concave depression that causes a center of the upper surface to be below outer edges of the upper surface;
a first memory gate arranged over the first channel region at a location that is laterally separated from the first select gate and vertically separated from the substrate by a first charge-trapping layer; and
a silicide-blocking cap having a curved, differentiable lower surface connected to opposite edges of an upper surface of the silicide-blocking cap, wherein the curved, differentiable lower surface contacts the upper surface of the first select gate.

18. The memory cell of claim 17, wherein the upper surface of the silicide-blocking cap is a substantially planar upper surface that is coplanar with a substantially planar upper surface of the first charge-trapping layer.

19. The memory cell of claim 17, further comprising:
a second source/drain region arranged within the substrate on an opposite side of the common source/drain region as the first source/drain region, wherein the second source/drain region is separated from the common source/drain region by a second channel region;
a second select gate arranged over the second channel region;
a second memory gate arranged over the second channel region at a location that is laterally separated from the second memory gate and vertically separated from the substrate by a second charge-trapping layer; and
wherein the first select gate is symmetric with the second select gate about a line bisecting a conductive contact contacting the common source/drain region.

20. The memory cell of claim 17, further comprising:
a first contact etch stop layer covering an inner sidewall of the first select gate and covering an outer sidewall of the first memory gate, wherein the first contact etch stop layer covers an upper surface of the first memory gate.

\* \* \* \* \*